(12) United States Patent
Nishida

(10) Patent No.: US 11,728,363 B2
(45) Date of Patent: Aug. 15, 2023

(54) SOLID-STATE IMAGING DEVICE, IMAGING DEVICE, AND ELECTRONIC APPARATUS

(71) Applicant: SONY SEMICONDUCTOR SOLUTIONS CORPORATION, Kanagawa (JP)

(72) Inventor: Keiji Nishida, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 168 days.

(21) Appl. No.: 17/250,626

(22) PCT Filed: Aug. 8, 2019

(86) PCT No.: PCT/JP2019/031339
§ 371 (c)(1),
(2) Date: Feb. 12, 2021

(87) PCT Pub. No.: WO2020/039958
PCT Pub. Date: Feb. 27, 2020

(65) Prior Publication Data
US 2021/0305302 A1    Sep. 30, 2021

(30) Foreign Application Priority Data
Aug. 22, 2018    (JP) .................... 2018-155518

(51) Int. Cl.
*H01L 27/146*    (2006.01)
(52) U.S. Cl.
CPC .. *H01L 27/14627* (2013.01); *H01L 27/14621* (2013.01)
(58) Field of Classification Search
CPC ......... H01L 27/14625; H01L 27/14627; H01L 27/14683; H01L 27/14685; H01L 33/58;
(Continued)

(56) References Cited

U.S. PATENT DOCUMENTS

| | | | |
|---|---|---|---|
| 2012/0205766 A1* | 8/2012 | Takachi | ............ H01L 27/14683 257/E31.127 |
| 2013/0038764 A1 | 2/2013 | Takachi | |

(Continued)

FOREIGN PATENT DOCUMENTS

| | | |
|---|---|---|
| JP | 2008-187170 A | 8/2008 |
| JP | 2009-123788 A | 6/2009 |

(Continued)

OTHER PUBLICATIONS

International Search Report and Written Opinion of PCT Application No. PCT/JP2019/031339, dated Oct. 21, 2019, 10 pages of ISRWO.

*Primary Examiner* — Lin Ye
*Assistant Examiner* — Tuan H Le
(74) *Attorney, Agent, or Firm* — Chip Law Group

(57) ABSTRACT

The present disclosure relates to a solid-state imaging device, an imaging device, and an electronic apparatus that are capable of suppressing generation of flare and also suppressing coloring caused by the flare with a simple configuration. A high refractive index layer is formed between a solid-state imaging element and a transparent protective substrate (glass substrate). When reflected light caused by diffracted light generated from an on-chip lens is reflected at an interface with the high refractive index layer, the reflected light is entirely reflected at a surface layer that is a transparent protective substrate and then the reflected light is sufficiently attenuated before being incident again. Consequently, flare and coloring caused by the flare are suppressed. The present disclosure is adaptable to an imaging device.

12 Claims, 20 Drawing Sheets

(58) Field of Classification Search
CPC ............... H01L 21/78; H01L 27/14609; H01L 27/14621; H01L 27/14618; H01L 27/14634; H01L 21/3205; H01L 21/768; H01L 23/522; G02B 5/282; G02B 5/285; H04N 5/2254; H04N 5/3532; H04N 5/365; H04N 9/04557; H04N 5/225; H04N 5/335
See application file for complete search history.

(56) References Cited

U.S. PATENT DOCUMENTS

2015/0334358 A1* 11/2015 Maeda .............. H01L 27/14685
                                                                348/276
2016/0172401 A1*  6/2016 Kawasaki ............ H04N 5/2257
                                                                348/241
2019/0057989 A1   2/2019 Ishiwata et al.

FOREIGN PATENT DOCUMENTS

| JP | 2012-175461 A | 9/2012 |
| JP | 2013-041941 A | 2/2013 |
| JP | 2017-174994 A | 9/2017 |
| WO | 2008/081828 A1 | 7/2008 |
| WO | 2017/163924 A1 | 9/2017 |

* cited by examiner

US 11,728,363 B2

SOLID-STATE IMAGING DEVICE, IMAGING DEVICE, AND ELECTRONIC APPARATUS

CROSS REFERENCE TO RELATED APPLICATIONS

This application is a U.S. National Phase of International Patent Application No. PCT/JP2019/031339 filed on Aug. 8, 2019, which claims priority benefit of Japanese Patent Application No. JP 2018-155518 filed in the Japan Patent Office on Aug. 22, 2018. Each of the above-referenced applications is hereby incorporated herein by reference in its entirety.

TECHNICAL FIELD

The present disclosure relates to a solid-state imaging device, an imaging device, and an electronic apparatus, and particularly relates to a solid-state imaging device, an imaging device, and an electronic apparatus in which generation of flare and coloring caused by the flare can be suppressed with a simple configuration.

BACKGROUND ART

In recent years, a chip scale package (CSP) structure is proposed as a simple packaging method of an imaging element, and imaging elements of this CSP structure are mass-produced.

But, flare (a ghost image) light, which has been never generated in a package structure other than the CSP structure, is generated in the above-described CSP structure, in which the flare is generated when light reflected at an upper surface of the imaging element is entirely reflected at sealing glass (a protective base) and incident again.

Considering this, there is a proposed technology in which flare is suppressed by forming a wavelength control film on sealing glass (see Patent Documents 1 and 2).

CITATION LIST

Patent Document

Patent Document 1: Japanese Patent Application Laid-Open No. 2012-175461
Patent Document 2: Japanese Patent Application Laid-Open No. 2013-041941

SUMMARY OF THE INVENTION

Problems to be Solved by the Invention

However, a wavelength control film disclosed in Patent Documents 1 and 2 have wavelength dependency, and there is a possibility that coloring caused by flare cannot be suppressed.

Furthermore, since the wavelength control film is formed by using a laminated film such as TiO/SiO and the like, a lot of man-hours are required to form the wavelength control film.

The present disclosure is made in view of such situations and is particularly directed to suppressing generation of flare and coloring caused by the flare with a simple configuration.

Solutions to Problems

A solid-state imaging device, an imaging device, and an electronic apparatus according to an aspect of the present disclosure are a solid-state imaging device, an imaging device, and an electronic apparatus in which a high refractive index layer having a refractive index higher than a refractive index of any one of a transparent protective substrate and a surface layer of an imaging surface of a solid-state imaging element is formed in a prior stage of the solid-state imaging element in a light incident direction.

In one aspect of the present disclosure, a high refractive index layer having a refractive index higher than a refractive index of any one of a transparent protective substrate and a surface layer of an imaging surface of a solid-state imaging element is formed in a prior stage of the solid-state imaging element in a light incident direction.

MODE FOR CARRYING OUT THE INVENTION

In the following, preferred embodiments of the present disclosure will be described in detail with reference to the accompanying drawings. Note that, in the present specification and the drawings, a constituent element having substantially the same functional configuration will be denoted by the same reference sign, and duplicate description will be omitted.

Modes for carrying out the present disclosure (hereinafter referred to as embodiments) will be described below. Note that the description will be provided in the following order.

1. First Embodiment
2. Second Embodiment
3. Third Embodiment
4. Fourth Embodiment
5. Fifth Embodiment
6. Sixth Embodiment
7. Seventh Embodiment
8. Exemplary Application to Electronic Apparatus
9. Exemplary Uses of Solid-State Imaging Device
10. Exemplary Application to Endoscopic Surgery System
11. Exemplary Application to Mobile Object 1. First Embodiment <Exemplary Configuration of Imaging Device of Present Disclosure>

Figure 1:
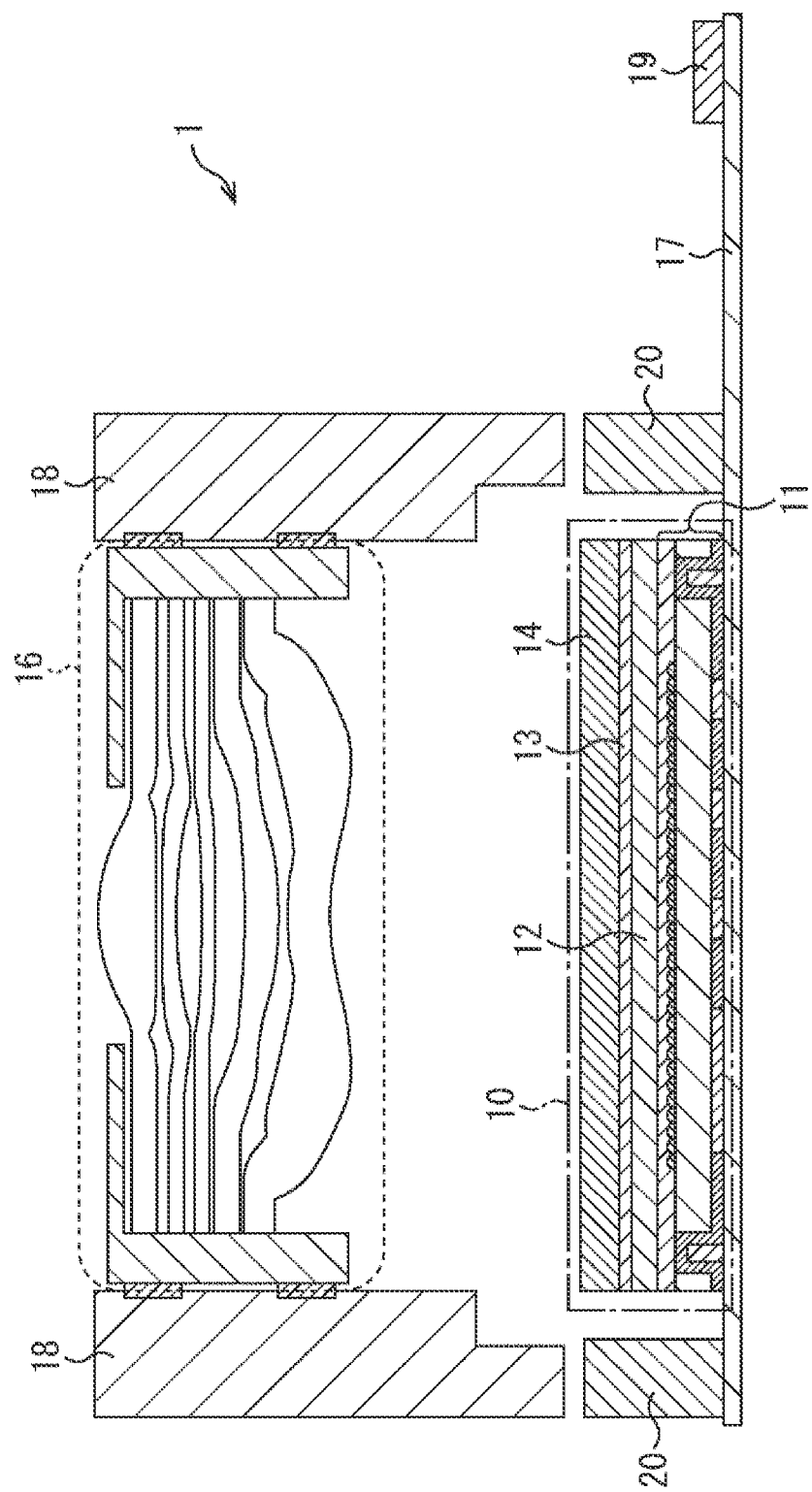
FIG. 1 is a view to describe an exemplary configuration of an imaging device of the present disclosure.

Referring to FIG. 1, a description will be provided for an exemplary configuration of the imaging device of the present disclosure that suppresses generation of flare and also suppresses coloring caused by the flare with a simple configuration. Note that FIG. 1 is a side cross-sectional view of the imaging device.

An imaging device 1 in FIG. 1 includes a solid-state imaging element 11, a high refractive index layer 12, a bonding resin 13, a protective substrate (a transparent protective substrate, seal glass, a glass substrate, and the like) 14, a lens group 16, a circuit board 17, an actuator 18, a connector 19, and a spacer 20.

The solid-state imaging element 11 is an image sensor including a complementary metal oxide semiconductor (so-called CMOS), a charge coupled device (CCD), or the like, and is fixed in a state of being electrically connected on the circuit board 17. As described later with reference to FIG. 4, the solid-state imaging element 11 includes a plurality of pixels arranged in an array, and generates, per pixel, a pixel signal corresponding to an amount of incident light which is incident from an upper side of the drawing after being condensed via the lens group 16, and then outputs the pixel signal as an image signal from the connector 19 to the outside via the circuit board 17.

The high refractive index layer 12 is provided on an upper surface portion of the solid-state imaging element 11 in FIG. 1. The high refractive index layer 12 is a single-layer film having a refractive index higher than a refractive index of any one of a flattening film 11e (FIG. 2) of the solid-state imaging element 11 and the bonding resin 13.

The high refractive index layer 12 includes, for example, a silicon compound such as a silicon nitride film, silicon carbide, or the like, a metal oxide such as a titanium oxide, a tantalum oxide, a niobium oxide, a hafnium oxide, an indium oxide, a tin oxide, or the like, a complex oxide of these, or an organic substance such as an acrylic resin, siloxane, or the like.

The high refractive index layer 12 and the protective substrate 14 are bonded by the bonding resin 13 having the same refractive index as that of the protective substrate 14.

That is, the solid-state imaging element 11, the high refractive index layer 12, and the protective substrate 14 are laminated and is formed as an integrated configuration by being mutually pasted by the transparent bonding resin 13, and connected to the circuit board 17. Note that the solid-state imaging element 11, the high refractive index layer 12, and the protective substrate 14 surrounded by an alternate long and short dash line in the drawing are mutually pasted by the bonding resin 13 and is integrally formed into a so-called chip scale package (CSP), and therefore, the configuration will be simply referred to as an integrated portion 10 as well.

The spacer 20 is formed on the circuit board 17 in a manner surrounding an entire portion where the solid-state imaging element 11, the high refractive index layer 12, and the protective substrate 14 are integrally formed. Furthermore, the actuator 18 is provided on the spacer 20. The actuator 18 is formed in a cylinder shape and has the lens group 16 built inside thereof, the lens group 16 is formed by laminating a plurality of lenses inside the cylinder, and the actuator 18 drives the lens group 16 in an up-down direction of FIG. 1.

With such a configuration, since the actuator 18 moves the lens group 16 in the up-down direction (a front-back direction with respect to an optical axis) in FIG. 1, autofocusing can be achieved by adjusting a focal point so as to form an image of a subject (not illustrated) on an imaging surface of the solid-state imaging element 11 in accordance with a distance to the subject located on the upper side of the drawing.

Figure 2:
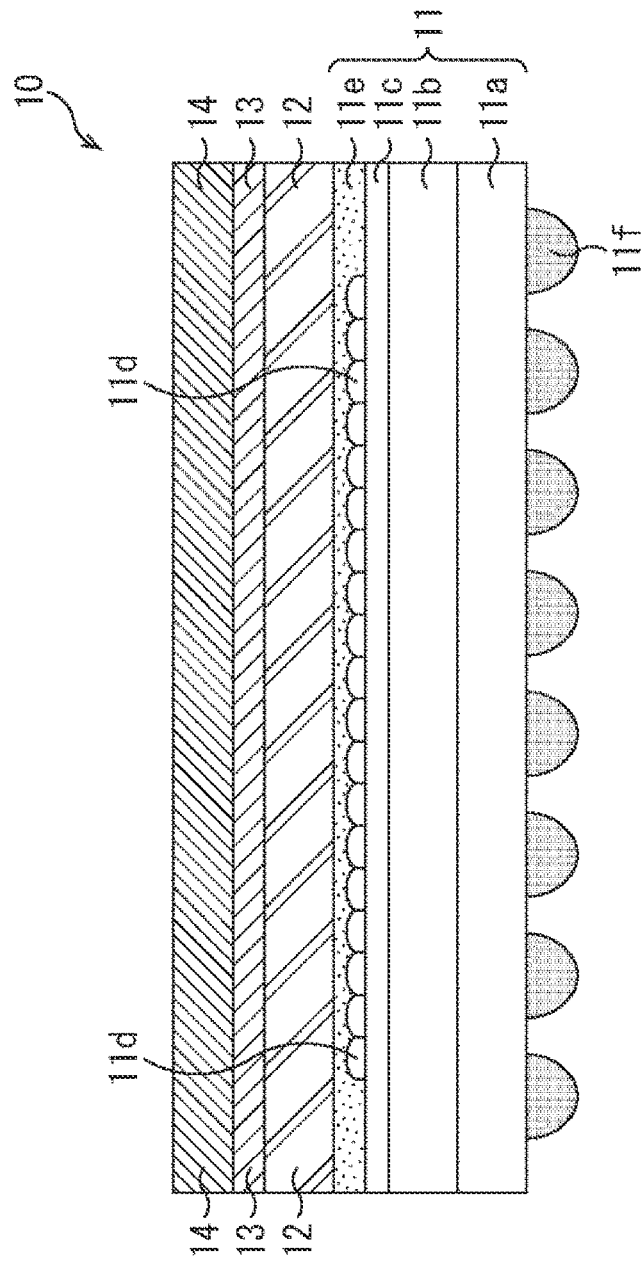
FIG. 2 is a schematic external view of an integrated portion including a solid-state imaging element in the imaging device in FIG. 1.

<Schematic External View> Next, a configuration of the integrated portion 10 will be described with reference to FIGS. 2, 3A, 3B, 4, 5, and 6. FIG. 2 illustrates a schematic external view of the integrated portion 10.

The integrated portion 10 illustrated in FIG. 2 is a semiconductor package, a so-called chip scale package (CSP) in which the solid-state imaging element 11 including a lamination substrate formed by laminating a lower substrate 11a and an upper substrate 11b is packaged.

A plurality of solder balls 11f corresponding to backside electrodes to provide electrical connection with the circuit board 17 of FIG. 1 is formed on the lower substrate 11a of the lamination substrate constituting the solid-state imaging element 11.

The upper substrate 11b has an upper surface on which an interlayer insulation film 11c, and an on-chip lens (microlens) 11d including a color filter of red (R), green (G), or blue (B) is formed. Furthermore, the upper substrate 11b is connected by a cavityless structure via the flattening film 11e and the interlayer insulation film 11c, in which the flattening film 11e is provided in order to protect and flatten the on-chip lens 11d.

Figure 3A:
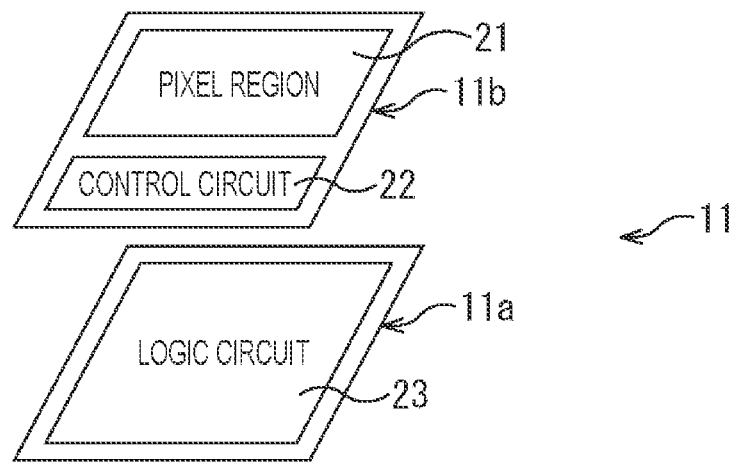
FIGS. 3A and 3B are diagrams to describe a substrate configuration of the integrated portion.

For example, as illustrated in FIG. 3A, a pixel region 21 in which pixel portions that perform photoelectric conversion are two-dimensionally arrayed in an array, and a control circuit 22 that controls the pixel portions are formed on the upper substrate 11b, and a logic circuit 23 such as a signal processing circuit or the like that processes a pixel signal output from the pixel portion is formed on the lower substrate 11a.

Figure 3B:
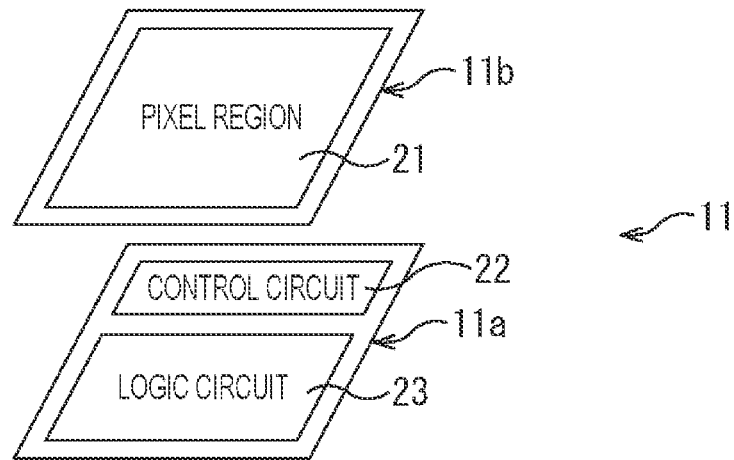

Alternatively, as illustrated in FIG. 3B, only the pixel region 21 may be formed on the upper substrate 11b, and the control circuit 22 and the logic circuit 23 may be formed on the lower substrate 11a.

As described above, since the logic circuit 23 or both the control circuit 22 and the logic circuit 23 are formed and laminated on the lower substrate 11a that is different from the upper substrate 11b of the pixel region 21, the imaging device 1 can be more downsized than in a case of arranging the pixel region 21, the control circuit 22, and the logic circuit 23 in a plane direction on one semiconductor substrate.

In the following, a description will be provided while referring to, as a pixel sensor substrate 11b, the upper substrate 11b having at least the pixel region 21 formed thereon, and referring to, as a logic substrate 11a, the lower substrate 11a having at least the logic circuit 23 formed thereon.

<Exemplary Configuration of Lamination Substrate>

Figure 4:
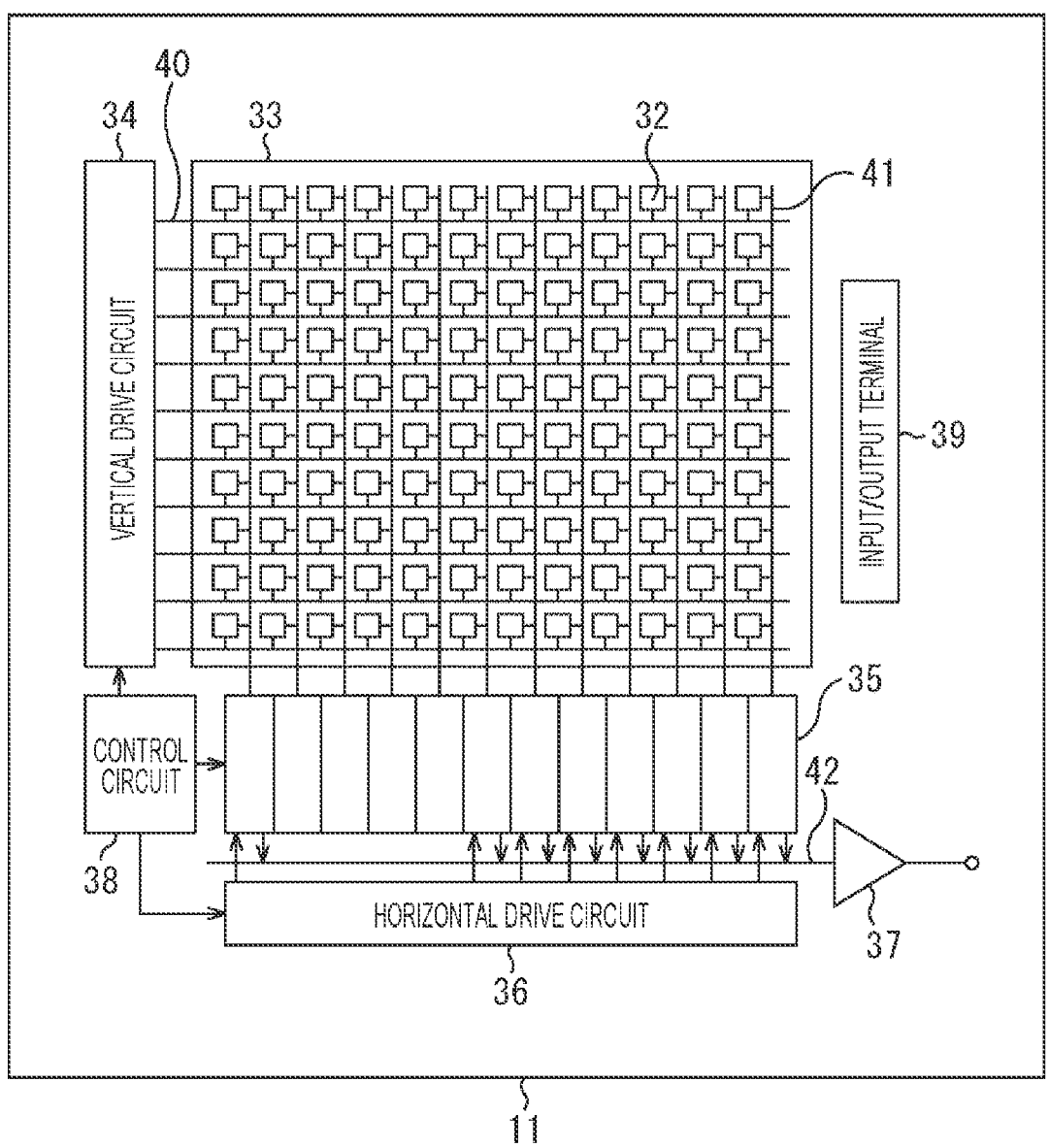
FIG. 4 is a diagram illustrating an exemplary circuit configuration of a lamination substrate.

FIG. 4 illustrates an exemplary circuit configuration of the solid-state imaging element 11.

The solid-state imaging element 11 includes a pixel array unit 33 in which pixels 32 are arrayed in a two-dimensional array, a vertical drive circuit 34, a column signal processing circuit 35, a horizontal drive circuit 36, an output circuit 37, a control circuit 38, and an input/output terminal 39.

A pixel 32 includes a photodiode as a photo-electric conversion element and a plurality of pixel transistors. An exemplary circuit configuration of the pixel 32 will be described later with reference to FIG. 5.

Furthermore, the pixel 32 can also have a pixel sharing structure. The pixel sharing structure includes a plurality of photodiodes, a plurality of transfer transistors, one shared floating diffusion (floating diffusion region), and another shared pixel transistor in each. That is, in sharing pixels, the photodiodes and the transfer transistors constituting a plurality of unit pixels are formed in a manner sharing another pixel transistor in each.

The control circuit 38 receives an input clock and data that commands an operation mode and the like, and also outputs data such as internal information and the like of the solid-state imaging element 11. That is, the control circuit 38 generates a clock signal or a control signal to be reference of operation of the vertical drive circuit 34, the column signal processing circuit 35, the horizontal drive circuit 36, and the like on the basis of a vertical synchronization signal, a horizontal synchronization signal, and a master clock. Then, the control circuit 38 outputs the generated clock signal or the generated control signal to the vertical drive circuit 34, the column signal processing circuit 35, the horizontal drive circuit 36, and the like.

The vertical drive circuit 34 includes, for example, a shift register and selects a predetermined pixel drive wire 40, supplies pulses to the selected pixel drive wire 40 in order to drive the pixels 32, and drives the pixels 32 in a row unit. That is, the vertical drive circuit 34 selectively and sequentially scans, in a vertical direction, each of the pixels 32 in a row unit of the pixel array unit 33, and supplies, through a vertical signal line 41, the column signal processing circuit 35 with a pixel signal based on signal electric charge generated in a photo-electric conversion unit in each of the pixels 32 in accordance with a received light amount.

The column signal processing circuit 35 is arranged per column of the pixels 32 and performs, per pixel column, signal processing such as noise removal and the like to a signal output from each of the pixels 32 included in one row. The column signal processing circuit 5 performs, for example, the signal processing such as correlated double sampling (CDS) to remove fixed-pattern noise peculiar to a pixel, AD conversion, and the like.

The horizontal drive circuit 36 includes, for example, a shift register, sequentially selects each of column signal processing circuits 35 by sequentially outputting a horizontal scanning pulse, and causes each of the column signal processing circuits 35 to output a pixel signal to a horizontal signal line 42.

The output circuit 37 performs signal processing for each of the signals sequentially supplied from each of the column signal processing circuits 35 through the horizontal signal line 42, and outputs the processed signal. There is a case where the output circuit 37 performs, for example, only buffering, or there is a case where the output circuit 37 performs black level adjustment, correction of column variation, various kinds of digital signal processing, and the like. The input/output terminal 39 exchanges signals with the outside.

The solid-state imaging element 11 thus configured is a CMOS image sensor called a column AD system in which the column signal processing circuit 35 that performs CDS processing and AD conversion processing is arranged per pixel column.

<Exemplary Circuit Configuration of Pixel>

Figure 5:
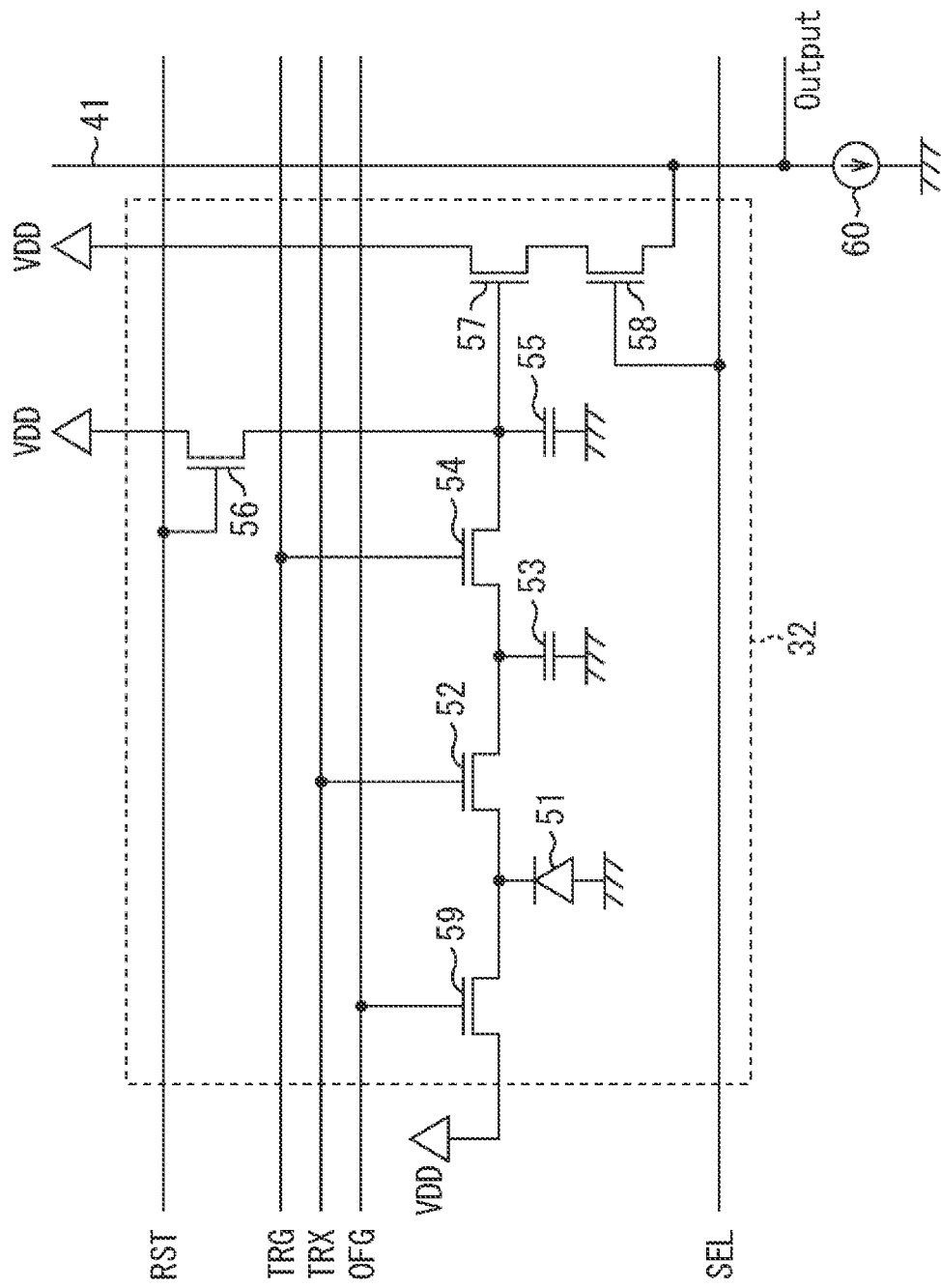
FIG. 5 is a diagram illustrating a pixel equivalent circuit.

FIG. 5 illustrates an equivalent circuit of the pixel 32.

The pixel 32 illustrated in FIG. 5 illustrates a configuration that implements an electronic global shutter function.

The pixel 32 includes a photodiode 51 as a photo-electric conversion element (a photo-electric conversion region), a first transfer transistor 52, a memory unit (MEM) 53, a second transfer transistor 54, a floating diffusion region (FD) 55, a reset transistor 56, an amplification transistor 57, a selection transistor 58, and a discharge transistor 59.

The photodiode 51 is a photo-electric conversion unit that generates and accumulates electric charge (signal electric charge) corresponding to a received light amount. The photodiode 51 has an anode terminal grounded and further has a cathode terminal connected to the memory unit 53 via the first transfer transistor 52. Furthermore, the cathode terminal of the photodiode 51 is connected also to the discharge transistor 59 that is provided to discharge unnecessary electric charge.

When the first transfer transistor 52 is turned on by a transfer signal TRX, the first transfer transistor 52 reads electric charge generated at the photodiode 51 and transfers the electric charge to the memory unit 53. The memory unit 53 is an electric charge holding unit that temporarily holds the electric charge until the electric charge is transferred to the FD 55.

When the second transfer transistor 54 is turned on by a transfer signal TRG, the second transfer transistor 54 reads the electric charge held in the memory unit 53 and transfers the electric charge to the FD 55.

The FD 55 is an electric charge holding unit that holds the electric charge in order to read, as a signal, the electric charge read from the memory unit 53. When the reset transistor 56 is turned on by a reset signal RST, the reset transistor 56 resets potential of the FD 55 by discharging, to a constant voltage source VDD, the electric charge accumulated in the FD 55.

The amplification transistor 57 outputs a pixel signal corresponding to the potential of the FD 55. That is, the amplification transistor 57 constitutes a source follower circuit with a load MOS 60 as a constant current source, and a pixel signal indicating a level corresponding to the electric charge accumulated in the FD 55 is output to the column signal processing circuit 35 (FIG. 4) from the amplification transistor 57 via the selection transistor 58. The load MOS 60 is arranged, for example, inside the column signal processing circuit 35.

The selection transistor 58 is turned on when a pixel 32 is selected by a selection signal SEL, and outputs a pixel signal of the pixel 32 to the column signal processing circuit 35 via the vertical signal line 41.

When the discharge transistor 59 is turned on by a discharge signal OFG, the discharge transistor 59 discharges, to the constant voltage source VDD, unnecessary electric charge accumulated in the photodiode 51.

The transfer signals TRX and TRG, the reset signal RST, the discharge signal OFG, and the selection signal SEL are supplied from the vertical drive circuit 34 via the pixel drive wire 40.

Operation of the pixel 32 will be briefly described.

First, the discharge transistor 59 is turned on when a discharge signal OFG having a high level is supplied to the discharge transistor 59 before starting exposure, and the electric charge accumulated in the photodiode 51 is discharged to the constant voltage source VDD to reset photodiodes 51 in all of pixels.

When the discharge transistor 59 is turned off by a discharge signal OFG having a low level after resetting the photodiodes 51, exposure is started in all of the pixels of the pixel array unit 33.

When a predetermined certain exposure time elapses, the first transfer transistors 52 are turned on by the transfer signal TRX in all of the pixels of the pixel array unit 33, and the electric charge accumulated in the photodiodes 51 is transferred to the memory unit 53.

After the first transfer transistor 52 is turned off, the electric charge held in the memory unit 53 of each pixel 32 is sequentially read out to the column signal processing circuit 35 in a row unit. In the reading operation, the second transfer transistor 54 of each of the pixels 32 located in a row to be read is turned on by the transfer signal TRG, and the electric charge held in the memory unit 53 is transferred to the FD 55. Then, when the selection transistor 58 is turned on by the selection signal SEL, a signal indicating a level corresponding to the electric charge accumulated in the FD 55 is output from the amplification transistor 57 to the column signal processing circuit 35 via the selection transistor 58.

As described above, in the pixel 32 having the pixel circuit of FIG. 5, it is possible to perform operation (imaging) by a global shutter system in which an exposure time is set uniform in all of the pixels of the pixel array unit 33, the electric charge is temporarily held in the memory unit 53 after completion of the exposure, and electric charge is sequentially read from the memory unit 53 in a row unit.

Note that the circuit configuration of each pixel 32 is not limited to the configuration illustrated in FIG. 5, and for example, it is also possible to adopt a circuit configuration that does not have the memory unit 53 and performs operation by a so-called rolling shutter system.

<Exemplary Basic Structure of Solid-State Imaging Device>

Figure 6:
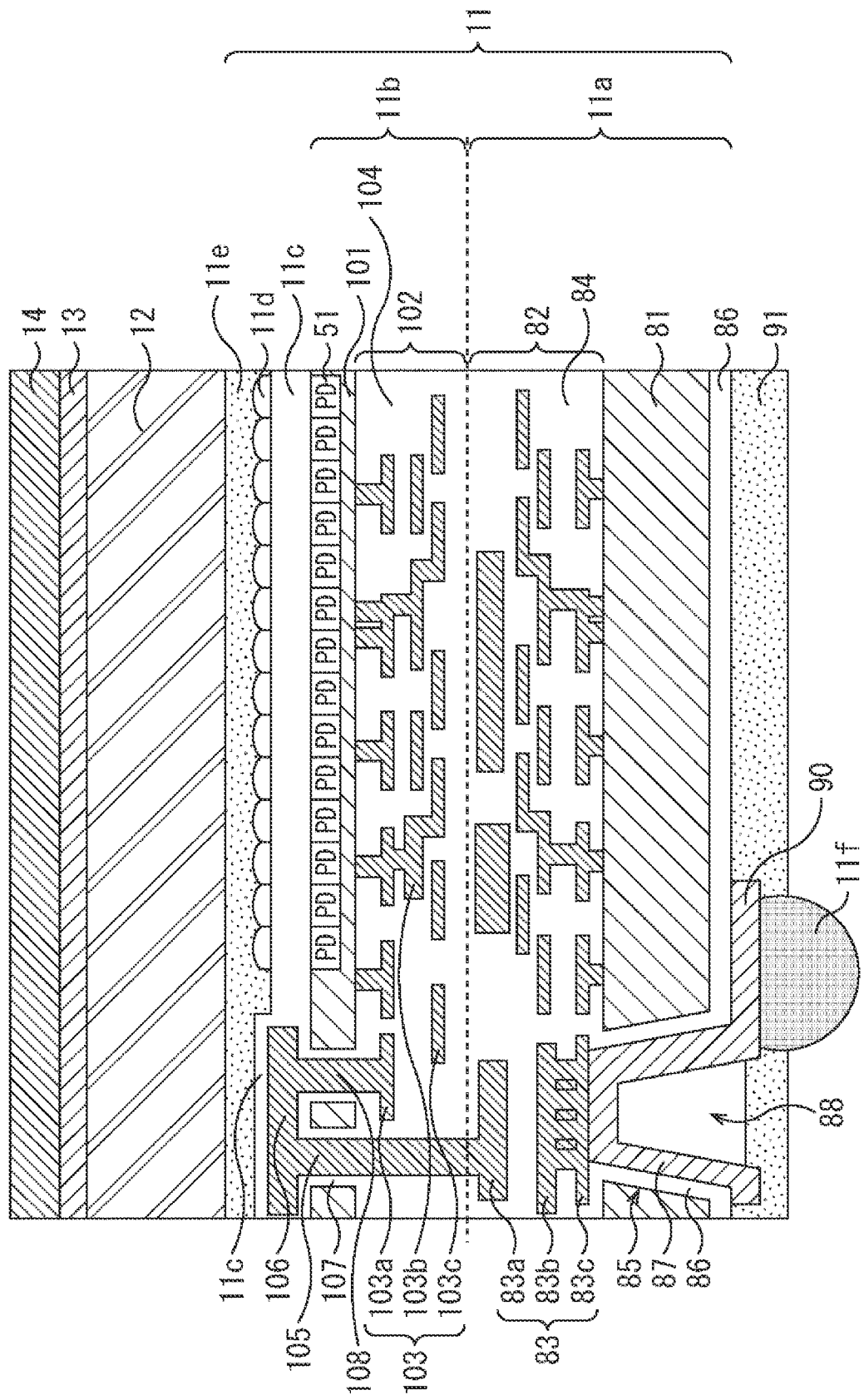
FIG. 6 is a view illustrating a detailed structure of the lamination substrate.

Next, a detailed structure of the solid-state imaging element 11 will be described with reference to FIG. 6. FIG. 6 is a cross-sectional view illustrating a part of the solid-state imaging element 11 in an enlarged manner.

In the logic substrate 11a, a multilayer wiring layer 82 is formed on an upper side (the pixel sensor substrate 11b side) of a semiconductor substrate 81 (hereinafter referred to as a silicon substrate 81) including, for example, silicon (Si). The multilayer wiring layer 82 constitutes the control circuit 22 and the logic circuit 23 of FIGS. 3A and 3B.

The multilayer wiring layer 82 includes: a plurality of wiring layers 83 including an uppermost wiring layer 83a closest to the pixel sensor substrate 11b, a middle wiring layer 83b, a lowermost wiring layer 83c closest to the silicon substrate 81, and the like; and an interlayer insulation film 84 formed between the respective wiring layers 83.

The plurality of wiring layers 83 is formed by using, for example, copper (Cu), aluminum (Al), tungsten (W), and the like, and the interlayer insulation film 84 is formed by using, for example, a silicon oxide film, a silicon nitride film, or the like. As for each of the plurality of wiring layers 83 and the interlayer insulation film 84, all of level layers may be formed by using the same material, or two or more materials may be suitably used depending on each level layer.

A silicon through hole 85 penetrating the silicon substrate 81 is formed at a predetermined position of the silicon substrate 81, and a through silicon via (TSV) 88 is formed by embedding a connection conductor 87 in an inner wall of the silicon through hole 85 via an insulation film 86. The insulation film 86 can be formed by using, for example, a SiO2 film, a SiN film, or the like.

Note that, in the through silicon via 88 illustrated in FIG. 6, the insulation film 86 and the connection conductor 87 are deposited along the inner wall surface, and the inside of the silicon through hole 85 is hollow, but there is a case where the inside of the silicon through hole 85 is entirely embedded with the connection conductor 87 depending on an inner diameter thereof. In other words, it makes no difference whether the inside of the through hole is embedded with the conductor or a part of the through hole is hollow. This also similarly applies to a through chip via (TCV) 105 or the like described later.

The connection conductor 87 of the through silicon via 88 is connected to rewiring 90 formed on a lower surface side of the silicon substrate 81, and the rewiring 90 is connected to the solder ball 11f. The connection conductor 87 and the rewiring 90 can be formed by using, for example, copper (Cu), tungsten (W), tungsten (W), polysilicon, and the like.

Furthermore, a solder mask (solder resist) 91 is formed on the lower surface side of the silicon substrate 81 in a manner covering the rewiring 90 and the insulation film 86 excluding a region where the solder balls 11f is formed.

On the other hand, in the pixel sensor substrate 11b, a multilayer wiring layer 102 is formed on a lower side (the logic substrate 11a side) of a semiconductor substrate 101 (hereinafter referred to as a silicon substrate 101) formed by using silicon (Si). This multilayer wiring layer 102 constitutes the pixel circuit of the pixel region 21 in FIGS. 3A and 3B.

The multilayer wiring layer 102 includes: a plurality of wiring layers 103 including an uppermost wiring layer 103a closest to the silicon substrate 101, a middle wiring layer 103b, a lowermost wiring layer 103c closest to the logic substrate 11a, and the like; and an interlayer insulation film 104 formed between the respective wiring layers 103.

As a material used as the plurality of wiring layers 103 and the interlayer insulation film 104, it is possible to adopt the same kind of material as the material(s) of the wiring layers 83 and the interlayer insulation film 84 described above. Furthermore, a point that one, or two or more materials may be suitably used for the plurality of wiring layers 103 and the interlayer insulation film 104 is also similar to the wiring layers 83 and the interlayer insulation film 84 described above.

Note that, in the example of FIG. 6, the multilayer wiring layer 102 of the pixel sensor substrate 11b includes the three wiring layers 103, and the multilayer wiring layer 82 of the logic substrate 11a includes the four wiring layers 83, but the total number of the wiring layers is not limited thereto, and these layers can be formed by using the arbitrary number of layers.

Inside the silicon substrate 101, a photodiode 51 formed by a PN junction is formed for each pixel 32.

Furthermore, although not illustrated, the plurality of pixel transistors such as the first transfer transistor 52, the second transfer transistor 54, and the like, the memory unit (MEM) 53, and the like are formed on the multilayer wiring layer 102 and the silicon substrate 101.

The through silicon via 108 connected to the wiring layer 103a of the pixel sensor substrate 11b, and the through chip via 105 connected to the wiring layer 83a of the logic substrate 11a are formed at predetermined positions of the silicon substrate 101 where the on-chip lens 11d is not formed.

The through chip via 105 and the through silicon via 108 are connected by connection wiring 106 formed on an upper surface of the silicon substrate 101. Furthermore, an insulation film 107 is formed between the silicon substrate 101 and each of the through silicon via 108 and the through chip via 105. Moreover, the on-chip lens 11d is formed on the upper surface of the silicon substrate 101 via the flattening film (insulation film) 11c.

As described above, the solid-state imaging element 11 illustrated in FIG. 2 has the lamination structure in which the multilayer wiring layer 102 side of the logic substrate 11a and the multilayer wiring layer 82 side of the pixel sensor substrate 11b are pasted to each other. In FIG. 6, the pasted surface between the multilayer wiring layer 102 side of the logic substrate 11a and the multilayer wiring layer 82 side of the pixel sensor substrate 11b is indicated by a broken line.

Furthermore, in the solid-state imaging element 11 of the imaging device 1, the wiring layer 103 of the pixel sensor substrate 11b and the wiring layer 83 of the logic substrate 11a are connected by the two through electrodes of the through silicon via 108 and the through chip via 105, and the wiring layer 83 of the logic substrate 11a and the solder ball (backside electrode) 11f are connected to the through silicon via 88 by the rewiring 90. Therefore, the plane area of the imaging device 1 can be reduced to the extreme.

Moreover, a size in a height direction can also be reduced by forming a cavityless structure between the high refractive index layer 12 and the protective substrate 14 on the solid-state imaging element 11 and pasting the high refractive index layer 12 and the protective substrate 14 to each other by the bonding resin 13.

Accordingly, with the imaging device 1 illustrated in FIG. 1, it is possible to achieve a more downsized semiconductor device (semiconductor package).

With the configuration of the imaging device 1 as described above, since the high refractive index layer 12 is provided between the protective substrate 14 and the solid-state imaging element 11, generation of flare caused by internal irregular reflection of light can be suppressed, and also coloring caused by the flare can be suppressed.

<Principle of Generation of Flare>

Figure 7:
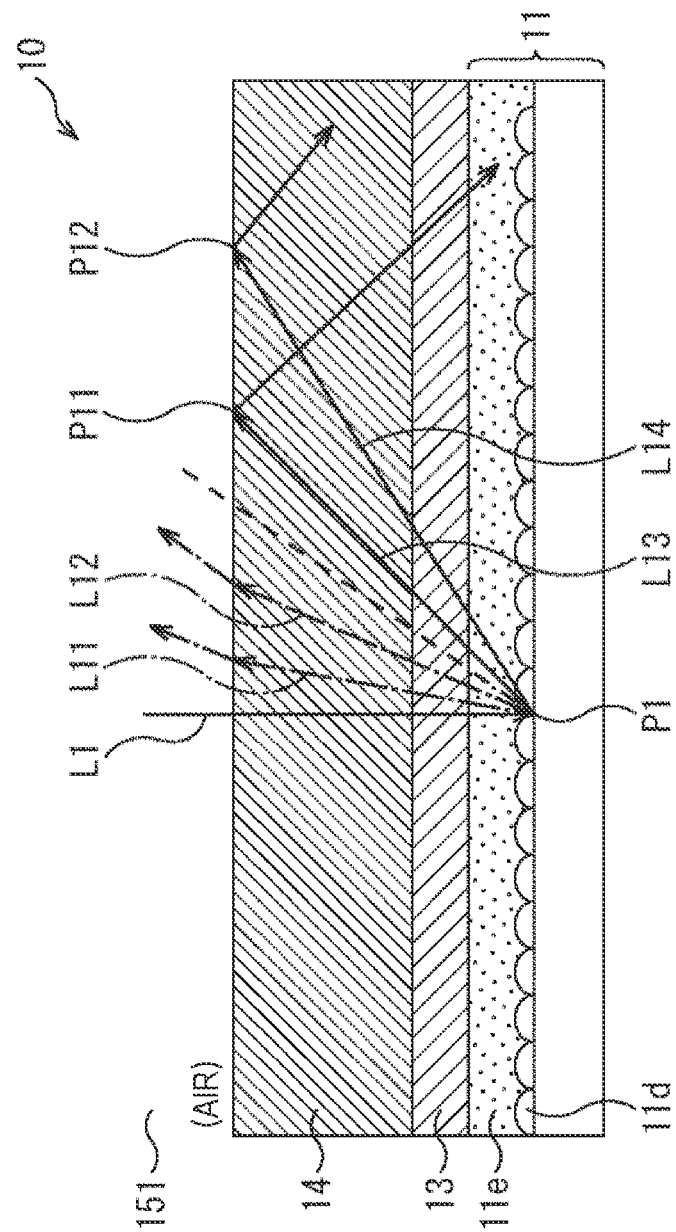
FIG. 7 is a view to describe generation of flare.

Here, the principle of generation of flare will be described. As illustrated in FIG. 7, in a case of the integrated portion 10 where the high refractive index layer 12 does not exist, incident light L1 is reflected at a position P1 on a surface layer of the on-chip lens 11d and further diffracted, thereby generating rays of reflected light L11 to L14.

Among the rays of the reflected light L11 to L14, the rays of the reflected light L11 and L12 each having a reflection angle smaller than a critical angle indicated by a dotted line pass through the bonding resin 13 and the protective substrate 14.

However, among the rays of the reflected light L11 to L14, the rays of the reflected light L13 and L14 each having a reflection angle larger than the critical angle indicated by the dotted line are entirely reflected again at positions P11 and P12 in a boundary between the protective substrate 14 and an air layer 151. In this case, the entirely-reflected rays of the reflected light L13 and L14 are incident again on the solid-state imaging element 11 by passing through the protective substrate 14 and the bonding resin 13 having the same reflection rate. The rays of the reflected light L13 and L14 that have been incident again cause the flare.

<Principle of Suppressing Generation of Flare>

Figure 8:
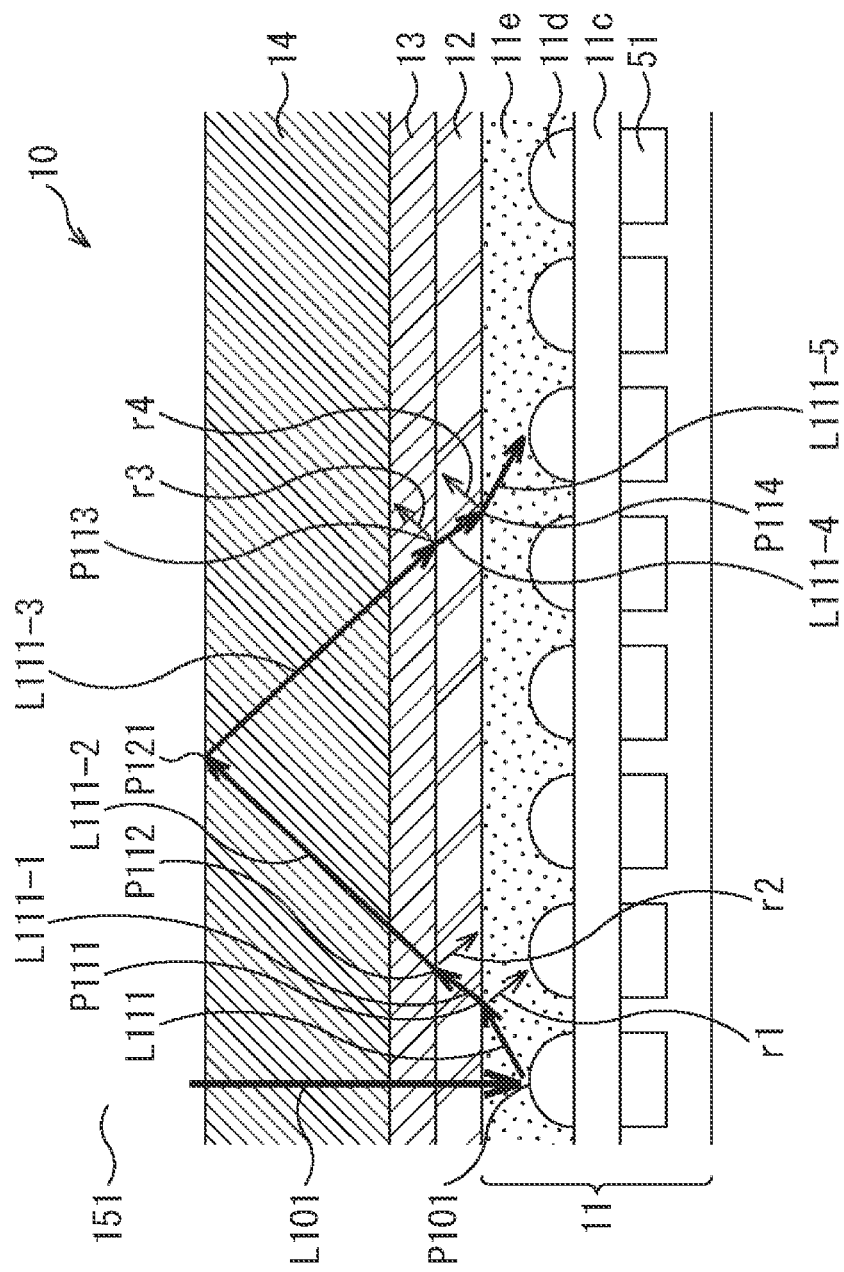
FIG. 8 is a view to describe an exemplary configuration of a first embodiment of an integrated portion of the present disclosure.

On the other hand, the integrated portion 10 in the imaging device 1 of FIG. 1 is provided with the high refractive index layer 12 between the bonding resin 13 and the solid-state imaging element 11 as illustrated in FIG. 8, thereby suppressing generation of flare. Now, to describe the principle of suppressing generation of the flare, consideration is given for reflected light L111 having a reflection angle larger than the critical angle out of reflected light generated when incident light L101 is reflected at a position P101 of the on-chip lens 11d.

In this case, when the reflected light L111 passes through the flattening film 11e, the reflected light L111 is partly reflected as reflected light r1 as indicated by an arrow at a position P111 in a boundary between the flattening film 11e and the high refractive index layer 12. Therefore, reflected light L111-1 having a light amount that has been reduced by an amount of the reflected light r1 from the reflected light L111 passes through the high refractive index layer 12.

Furthermore, when the reflected light L111-1 passes through the high refractive index layer 12, the reflected light L111-1 is partly reflected as reflected light r2 as indicated by an arrow at a position P112 in a boundary between the high refractive index layer 12 and the bonding resin 13. Therefore, reflected light L111-2 having a light amount that has been reduced by an amount of the reflected light r2 from the reflected light L111-1 passes through the bonding resin 13 and the protective substrate 14.

Moreover, when the reflected light L111-2 passes through the bonding resin 13 and the protective substrate 14, the reflected light L111-2 is entirely reflected as indicated by an arrow at a position P121 in a boundary between the protective substrate 14 and the air layer 151, and again passes through the protective substrate 14 and the bonding resin 13 as reflected light L111-3.

Then, when the reflected light L111-3 passes through the protective substrate 14 and the bonding resin 13, the reflected light L111-3 is partly reflected as reflected light r3 as indicated by an arrow at a position P113 in a boundary between the bonding resin 13 and the high refractive index layer 12. Therefore, reflected light L111-4 having a light amount that has been reduced by an amount of the reflected light r3 from the reflected light L111-2 passes through the high refractive index layer 12.

Moreover, when the reflected light L111-4 passes through the high refractive index layer 12, the reflected light L111-4 is partly reflected as reflected light r4 as indicated by an arrow at a position P114 in a boundary between the high refractive index layer 12 and the flat film 11d. Therefore, reflected light L111-5 having a light amount that has been reduced by an amount of the reflected light r4 from the reflected light L111-4 is incident again on the on-chip lens 11d.

That is, the reflected light L111 is partly reflected as the rays of the reflected light r1 to r4 at the respective positions P111 to P114 on interfaces with the high refractive index layer 12 (an interface between the high refractive index layer 12 and the flattening film 11e, and an interface between the bonding resin 13 and the high refractive index layer 12). Therefore, the amount of the reflected light L111 is gradually reduced, and the reflected light is incident again on the on-chip lens 11d finally as the reflected light L111-5.

As a result, as described with reference to FIG. 8, the reflected light L111-5 becomes the light having the light amount sufficiently reduced from the reflected light L111, and then is incident again on the solid-state imaging element 11 in the integrated portion 10 of the imaging device 1 in FIG. 1, and therefore, generation of flare is suppressed, and also coloring caused by the flare is suppressed.

Furthermore, the high refractive index layer 12 has a single-layer structure, the configuration is more simplified and man-hours in manufacturing is more reduced than, for example, those in a case of a wavelength control film or the like formed by laminating layers, and therefore, it is possible to reduce a manufacturing cost.

2. Second Embodiment

A description has been provided above for an example in which a high refractive index layer 12 is formed between a flattening film 11e of a solid-state imaging element 11 and a bonding resin 13, but the high refractive index layer 12 may also be formed at a different position as far as the high refractive index layer 12 can form an interface with another layer so as to be able to gradually reduce an amount of reflected light between a protective substrate 14 and the flattening film 11e, and therefore, the high refractive index layer 12 may be formed between, for example, the bonding resin 13 and the protective substrate 14.

Figure 9:
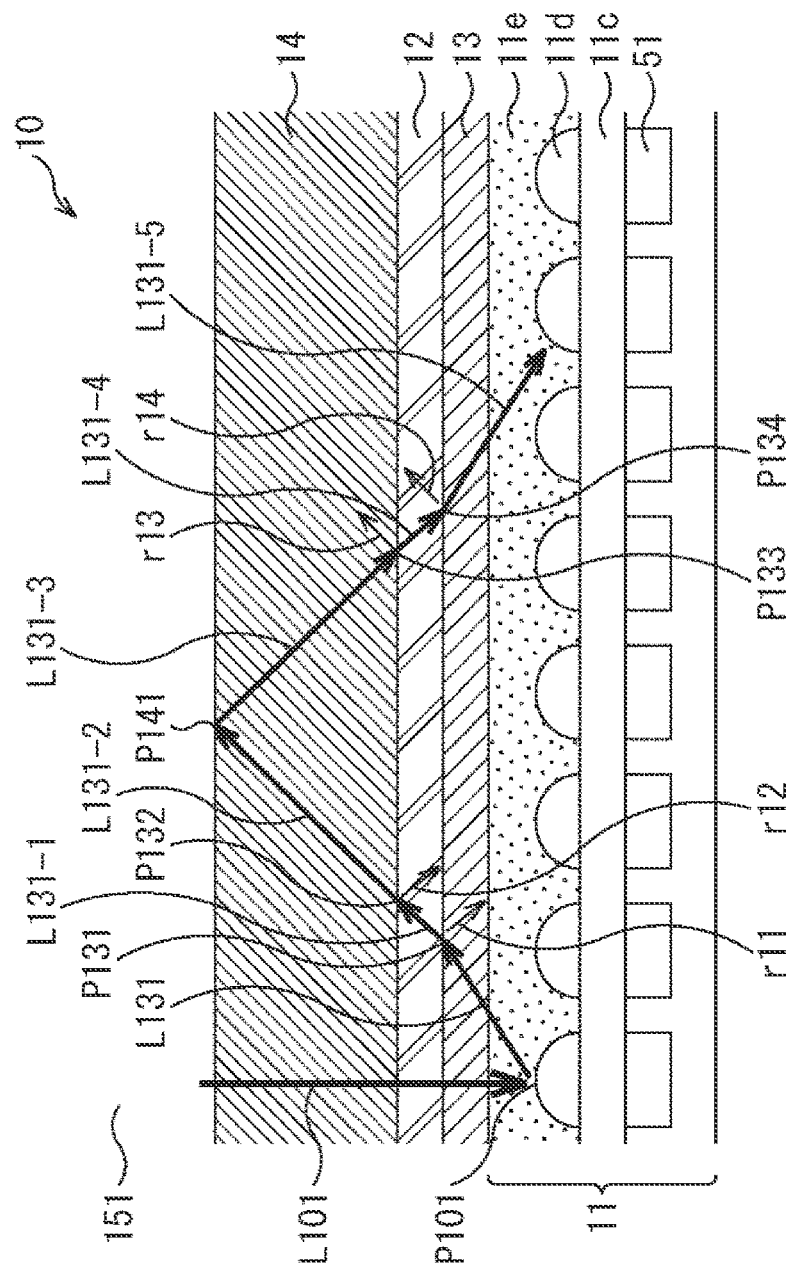
FIG. 9 is a view to describe an exemplary configuration of a second embodiment of an integrated portion of the present disclosure.

FIG. 9 illustrates a side cross-section of an integrated portion 10 when the high refractive index layer 12 is formed between the bonding resin 13 and the protective substrate 14. That is, in the integrated portion 10 of FIG. 9, the solid-state imaging element 11, the bonding resin 13, the high refractive index layer 12, and the protective substrate 14 are sequentially laminated from a lower side of the drawing, and the high refractive index layer 12 is formed between the bonding resin 13 and the protective substrate 14.

Here, consideration is given with reference to FIG. 9 for reflected light L131 having a reflection angle larger than a critical angle out of reflected light of incident light L101 reflected at a position P101 of an on-chip lens 11d.

In this case, when the reflected light L131 passes through the flattening film 11e and the bonding resin 13, the reflected light L131 is partly reflected as reflected light r11 as indicated by an arrow at a position P131 in a boundary between the bonding resin 13 and the high refractive index layer 12. Therefore, reflected light L131-1 having a light amount that has been reduced by an amount of the reflected light r11 from the reflected light L131 passes through the high refractive index layer 12.

Furthermore, when the reflected light L131-1 passes through the high refractive index layer 12, the reflected light L131-1 is partly reflected as reflected light r12 as indicated by an arrow at a position P132 in a boundary between the high refractive index layer 12 and the protective substrate 14. Therefore, reflected light L131-2 having a light amount that has been reduced by an amount of the reflected light r12 from the reflected light L131-1 passes through the protective substrate 14.

Moreover, when the reflected light L131-2 passes through the protective substrate 14, the reflected light L131-2 is entirely reflected as indicated by an arrow at a position P141 in a boundary between the protective substrate 14 and the air layer 151, and again passes through the protective substrate 14 as reflected light L131-3.

Furthermore, when the reflected light L131-3 passes through the protective substrate 14, the reflected light L131-3 is partly reflected as indicated by an arrow as reflected light r13 at a position P133 in the boundary between the protective substrate 14 and the high refractive index layer 12. Therefore, reflected light L131-4 having a light amount that has been reduced by an amount of the reflected light r13 from the reflected light L131-3 passes through the high refractive index layer 12.

Moreover, when the reflected light L131-4 passes through the high refractive index layer 12, the reflected light L131-4 is partly reflected as reflected light r14 as indicated by an arrow at a position P134 in the boundary between the high refractive index layer 12 and the bonding resin 13. Therefore, reflected light L131-5 having a light amount that has been reduced by an amount of the reflected light r14 from the reflected light L131-4 passes through the bonding resin 13 and the flattening film 11e and is incident again on the on-chip lens 11d.

That is, since the reflected light L131 is sequentially and partly reflected as the rays of the reflected light r11 to r14 at the respective positions P131 to P134, the amount of the reflected light L131 is gradually reduced and incident again on the on-chip lens 11d as the reflected light L131-5.

As a result, the reflected light L131-5 incident again on the solid-state imaging element 11 becomes the light having the light amount sufficiently reduced from the reflected light L131, and then is incident again on the solid-state imaging element 11 in the integrated portion 10 of FIG. 9, and therefore, generation of flare is suppressed, and also coloring caused by the flare is suppressed.

Furthermore, since the high refractive index layer 12 has a single-layer structure, the configuration is more simplified and man-hours for manufacturing is more reduced than, for example, those in a case of a wavelength control film or the like formed by laminating layers, and therefore, it is possible to reduce a manufacturing cost.

3. Third Embodiment

A description has been provided above for an example in which a high refractive index layer 12 is formed between a bonding resin 13 and a protective substrate 14, but a plurality of high refractive index layers 12 may be formed.

Figure 10:
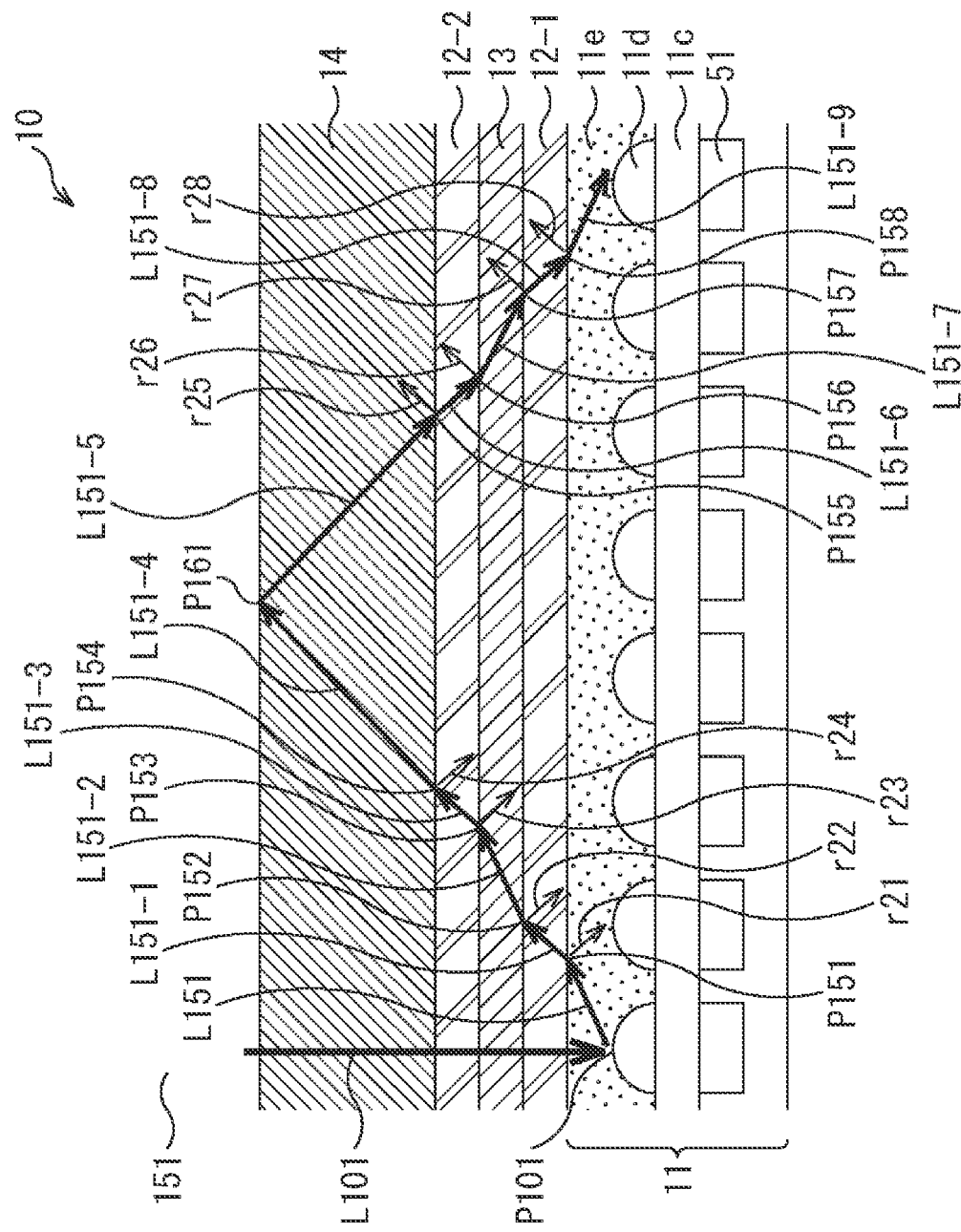
FIG. 10 is a view to describe an exemplary configuration of a third embodiment of an integrated portion of the present disclosure.

FIG. 10 illustrates a side cross-section of an integrated portion 10 when two high refractive index layers 12-1 and 12-2 are formed.

That is, the high refractive index layer 12-1 is formed between a flattening film 11e of a solid-state imaging element 11 and a bonding resin 13, and the high refractive index layer 12-2 is formed between the bonding resin 13 and the protective substrate 14 in the integrated portion 10 of FIG. 10.

Here, consideration is given for reflected light L151 having a reflection angle larger than a critical angle out of reflected light of incident light L101 reflected at a position P101 of an on-chip lens 11d in the integrated portion 10 of FIG. 10.

In this case, when the reflected light L151 passes through the flattening film 11e, the reflected light L151 is partly reflected as reflected light r21 as indicated by an arrow at a position P151 in a boundary between the flattening film 11e and the high refractive index layer 12-1. Therefore, reflected light L151-1 having a light amount that has been reduced by an amount of the reflected light r21 from the reflected light L151 passes through the high refractive index layer 12-1.

Furthermore, when the reflected light L151-1 passes through the high refractive index layer 12-1, the reflected light L151-1 is partly reflected as reflected light r22 as indicated by an arrow at a position P152 in a boundary between the high refractive index layer 12-1 and the bonding resin 13. Therefore, reflected light L151-2 having a light amount that has been reduced by an amount of the reflected light r22 from the reflected light L151-1 passes through the bonding resin 13.

Moreover, when the reflected light L151-2 passes through the bonding resin 13, the reflected light L151-2 is partly reflected as reflected light r23 as indicated by an arrow at a position P153 in a boundary between the bonding resin 13 and the high refractive index layer 12-2. Therefore, reflected light L151-3 having a light amount that has been reduced by an amount of the reflected light r23 from the reflected light L151-2 passes through the high refractive index layer 12-2.

Furthermore, when the reflected light L151-3 passes through the high refractive index layer 12-2, the reflected light L151-3 is partly reflected as reflected light r24 as indicated by an arrow at a position P154 in a boundary between the high refractive index layer 12-2 and the protective substrate 14. Therefore, reflected light L151-4 having a light amount that has been reduced by an amount of the reflected light r24 from the reflected light L151-3 passes through the protective substrate 14.

Moreover, when the reflected light L151-4 passes through the protective substrate 14, the reflected light L151-4 is entirely reflected as indicated by an arrow at a position P161 in a boundary between the protective substrate 14 and an air layer 151, and again passes through the protective substrate 14 as reflected light L151-5.

Furthermore, when the reflected light L151-5 passes through the protective substrate 14, the reflected light L151-5 is partly reflected as indicated by an arrow as reflected light r25 at a position P155 in the boundary between the protective substrate 14 and the high refractive index layer 12-2. Therefore, reflected light L151-6 having a light amount that has been reduced by an amount of the reflected light r25 from the reflected light L151-5 passes through the high refractive index layer 12-2.

Moreover, when the reflected light L151-6 passes through the high refractive index layer 12-2, the reflected light L151-6 is partly reflected as reflected light r26 as indicated by an arrow at a position P156 in the boundary between the high refractive index layer 12-2 and the bonding resin 13. Therefore, reflected light L151-7 having a light amount that has been reduced by an amount of the reflected light r26 from the reflected light L151-6 passes through the bonding resin 13.

Furthermore, when the reflected light L151-7 passes through the bonding resin 13, the reflected light L151-7 is partly reflected as reflected light r27 as indicated by an arrow at a position P157 in the boundary between the bonding resin 13 and the high refractive index layer 12-1. Therefore, reflected light L151-8 having a light amount that has been reduced by an amount of the reflected light r27 from the reflected light L151-7 passes through the high refractive index layer 12-1.

Moreover, when the reflected light L151-8 passes through the high refractive index layer 12-1, the reflected light L151-8 is partly reflected as reflected light r28 as indicated by an arrow at a position P158 in the boundary between the high refractive index layer 12-1 and the flattening film 11e of the solid-state imaging element 11. Reflected light L151-9 having a light amount that has been reduced by an amount of the reflected light r28 from the reflected light L151-8 is incident again on the on-chip lens 11d.

That is, since the reflected light L151 is sequentially and partly reflected as the rays of the reflected light r21 to r28 at the respective positions P151 to P158, the amount of the reflected light L151 is gradually reduced and finally is incident again on the on-chip lens 11d as the reflected light L151-9.

As a result, as described with reference to FIG. 10, the reflected light L151-9 becomes the light having the light amount sufficiently reduced from the reflected light L151, and then is incident again on the solid-state imaging element 11 in the integrated portion 10 of the imaging device 1 in FIG. 1, and therefore, generation of flare is suppressed, and also coloring caused by the flare is suppressed.

Note that the high refractive index layers 12-1 and 12-2 constitute a two-layer configuration in the integrated portion 10 of FIG. 10 compared with a configuration of the integrated portion 10 in each of FIGS. 8 and 9, and therefore, since an interface is doubled and the amount of the reflected light to be incident again on the solid-state imaging element 11 is further reduced, it is possible to suppress the flare and the coloring caused by the flare.

Furthermore, since any one of the high refractive index layers 12-1 and 12-2 has a single-layer structure, the configuration is more simplified and man-hours for manufacturing is more reduced than those in a case of a wavelength control film or the like formed by laminating layers, and therefore, it is possible to reduce a manufacturing cost.

Note that the description has been provided for the case where the high refractive index layer 12 has the two-layer structure, but a multi-layer structure having the larger number of layers may also be adopted, in which an amount of reflected light that is incident again on the solid-state imaging element 11 can be more reduced by forming the plurality of the high refractive index layers 12, and it is possible to further suppress the generation of flare and the coloring caused by the flare.

4. Fourth Embodiment

A description has been provided above for an example of having a two-layer structure of high refractive index layers 12-1 and 12-2, but a bonding resin 13 may be made to have a high refractive index.

Figure 11:
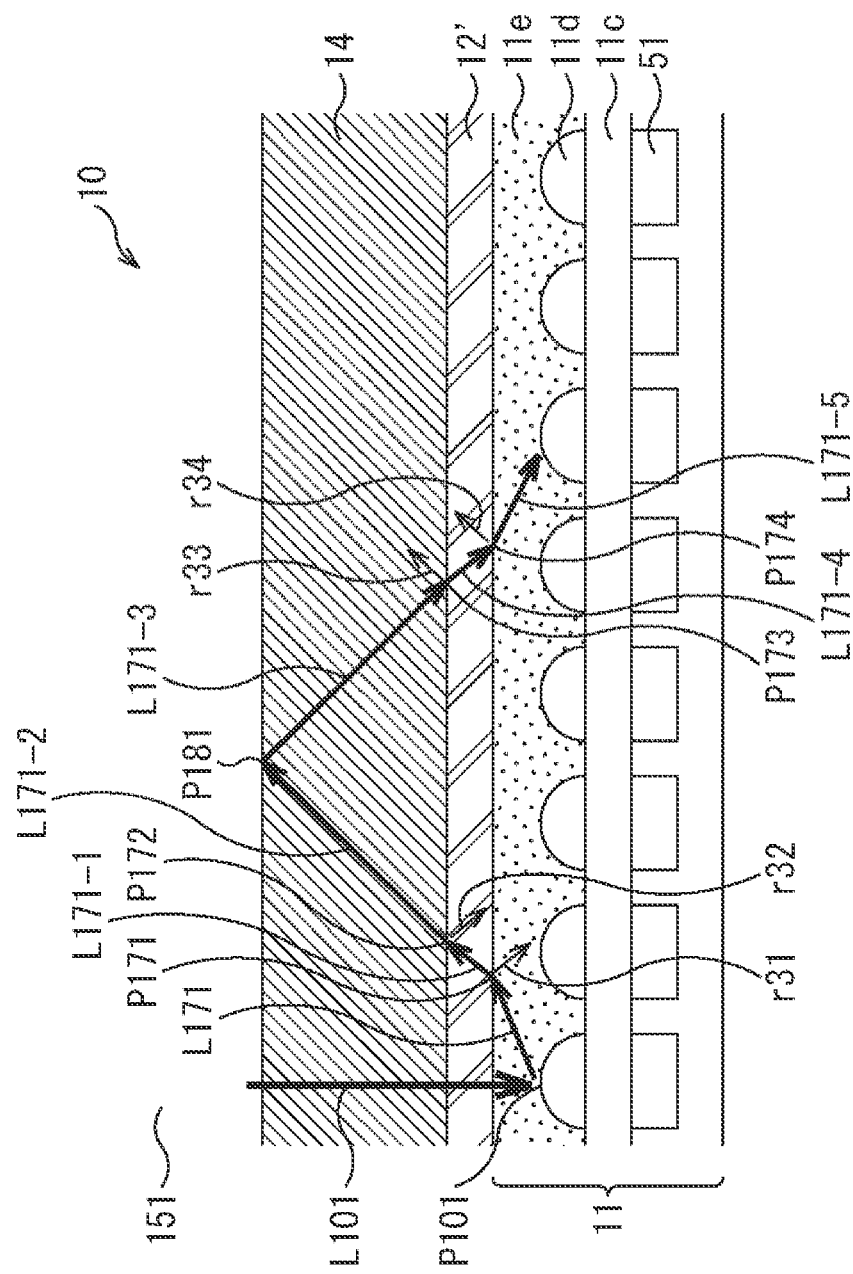
FIG. 11 is a view to describe an exemplary configuration of a fourth embodiment of an integrated portion of the present disclosure.

FIG. 11 illustrates a side cross-section of an integrated portion 10 in which a highly-refractive bonding resin 12' is formed instead of a high refractive index layer 12 and a bonding resin 13. That is, in the integrated portion 10 of FIG. 11, the highly-refractive bonding resin 12' that is a bonding resin made to have the high refractive index is formed between a flattening film 11e of a solid-state imaging element 11 and a protective substrate 14.

Here, consideration is given with reference to FIG. 11 for reflected light L171 having a reflection angle larger than a critical angle out of reflected light of incident light L101 reflected at a position P101 of an on-chip lens 11d.

In this case, when the reflected light L171 passes through the flattening film 11e, the reflected light L171 is partly reflected as reflected light r31 as indicated by an arrow at a position P171 in a boundary between the flattening film 11e and the highly-refractive bonding resin 12'. Therefore, reflected light L171-1 having a light amount that has been reduced by an amount of the reflected light r31 from the reflected light L171 passes through the highly-refractive bonding resin 12'.

Furthermore, when the reflected light L171-1 passes through the highly-refractive bonding resin 12', the reflected light L171-1 is partly reflected as reflected light r32 as indicated by an arrow at a position P172 in a boundary between the highly-refractive bonding resin 12' and the protective substrate 14. Therefore, reflected light L171-2 having a light amount that has been reduced by an amount of the reflected light r32 from the reflected light L171-1 passes through the protective substrate 14.

Moreover, when the reflected light L171-2 passes through the protective substrate 14, the reflected light L171-2 is entirely reflected as indicated by an arrow at a position P181 in a boundary between the protective substrate 14 and an air layer 151, and again passes through the protective substrate 14 as reflected light L171-3.

Furthermore, when the reflected light L171-3 passes through the protective substrate 14, the reflected light L171-3 is partly reflected as reflected light r33 as indicated by an arrow at a position P173 in the boundary between the protective substrate 14 and the highly-refractive bonding resin 12'. Therefore, reflected light L171-4 having a light amount that has been reduced by an amount of the reflected light r33 from the reflected light L171-3 passes through the highly-refractive bonding resin 12'.

Moreover, when the reflected light L171-4 passes through the highly-refractive bonding resin 12', the reflected light L171-4 is partly reflected as reflected light r34 as indicated by an arrow at a position P174 in the boundary between the highly-refractive bonding resin 12' and the flattening film 11e. Therefore, reflected light L171-5 having a light amount that has been reduced by an amount of the reflected light r34 from the reflected light L171-4 passes through the flattening film 11e and is incident again on the on-chip lens 11d.

That is, the reflected light L171 is sequentially and partly reflected as the rays of the reflected light r31 to r34 at the respective positions P171 to P174. Therefore, the amount of the reflected light L171 is gradually reduced, and the reflected light is incident again on the on-chip lens 11d as the reflected light L171-5.

As a result, in the integrated portion 10 of FIG. 11, the reflected light L171-5 incident again on the solid-state imaging element 11 is to be incident again in a state in which the light amount is sufficiently reduced from the reflected light L171, and therefore, generation of flare is suppressed, and also coloring caused by the flare is suppressed.

Furthermore, since the highly-refractive bonding resin 12' has a single-layer structure, the configuration is more simplified and man-hours for manufacturing is more reduced than, for example, those in a case of a wavelength control film or the like formed by laminating layers, and therefore, it is possible to reduce a manufacturing cost.

Moreover, since the flattening film 11e of the solid-state imaging element 11 and the protective substrate 14 are only to be pasted to each other by the highly-refractive bonding resin 12', the man-hours can be further reduced.

Note that, in the integrated portion 10 of FIG. 11, it is necessary to set the refractive index of the highly-refractive bonding resin 12' higher than refractive indexes of the flattening film 11e and the protective substrate (glass) 14.

5. Fifth Embodiment

A description has been provided above for an example in which a highly-refractive bonding resin 12' is provided instead of a high refractive index layer 12 and a bonding resin 13, but a protective substrate 14 may be made to have a high refractive index.

Figure 12:
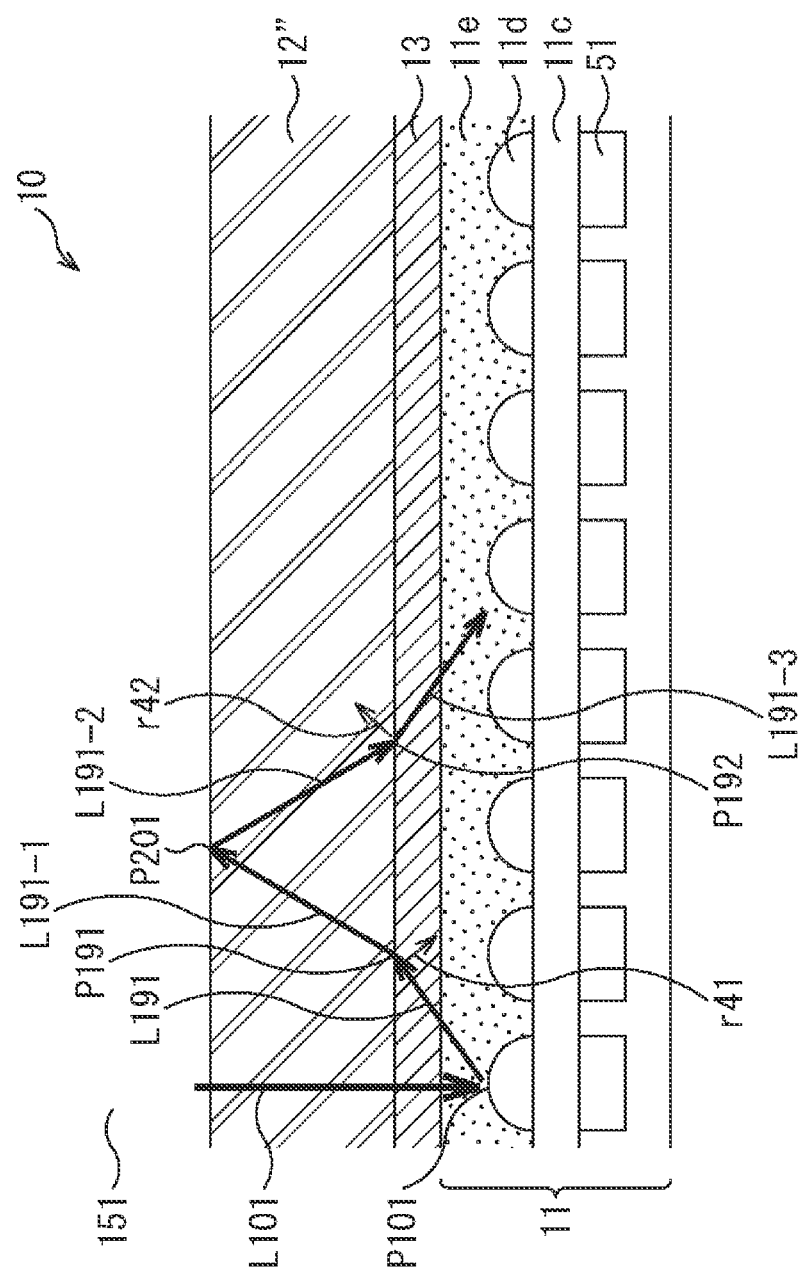
FIG. 12 is a view to describe an exemplary configuration of a fifth embodiment of an integrated portion of the present disclosure.

FIG. 12 illustrates a side cross-section of an integrated portion 10 in which a high refractive protective substrate 12" is formed instead of the protective substrate 14. That is, in the integrated portion 10 of FIG. 12, the high refractive protective substrate 12" that is a protective substrate having the high refractive index is formed instead of the high refractive index layer 12 and the protective substrate 14.

Here, consideration is given with reference to FIG. 12 for reflected light L191 having a reflection angle larger than a critical angle out of reflected light of incident light L101 reflected at a position P101 of an on-chip lens 11d.

In this case, when the reflected light L191 passes through a flattening film 11e and the bonding resin 13, the reflected light L191 is partly reflected as reflected light r41 as indicated by an arrow at a position P191 in a boundary between the bonding resin 13 and the high refractive protective substrate 12". Therefore, reflected light L191-1 having a light amount that has been reduced by an amount of the reflected light r41 from the reflected light L191 passes through the high refractive protective substrate 12".

Furthermore, when the reflected light L191-1 passes through the high refractive protective substrate 12", the reflected light L191-1 is entirely reflected as indicated by an arrow at a position P201 in a boundary between the high refractive protective substrate 12" and an air layer 151, and then passes through again the high refractive protective substrate 12" as reflected light L191-2.

Furthermore, when the reflected light L191-2 passes through the high refractive protective substrate 12", the reflected light L191-2 is partly reflected as reflected light r42 as indicated by an arrow at a position P192 in the boundary between the high refractive protective substrate 12" and the bonding resin 13. Therefore, reflected light L191-3 having a light amount that has been reduced by an amount of the reflected light r42 from the reflected light L191-2 passes through the bonding resin 13 and the flattening film 11e and is incident again on the on-chip lens 11d.

That is, since the reflected light L191 is sequentially and partly reflected as the rays of the reflected light r41 and r42 at the respective positions P191 and P192, the amount of the reflected light L191 is gradually reduced and incident again on the on-chip lens 11d as the reflected light L191-3.

As a result, in the integrated portion 10 of FIG. 12, the reflected light L191-3 incident again on the solid-state imaging element 11 is to be incident again in a state in which the light amount is sufficiently reduced from the reflected light L191, and therefore, generation of flare is suppressed, and also coloring caused by the flare is suppressed.

Furthermore, since the integrated portion 10 of FIG. 12 has the structure in which the high refractive protective substrate 12" and the flattening film 11e of the solid-state imaging element 11 are simply pasted to each other by the bonding resin 13, man-hours for manufacturing is more reduced than the integrated portions 10 of FIGS. 8 to 11, and therefore, a manufacturing cost can be further reduced.

Note that, in the integrated portion 10 of FIG. 12, it is necessary to set the refractive index of the high refractive protective substrate 12" higher than that of the bonding resin 13 in order to reduce flare by utilizing reflection due to a refractive index difference.

6. Sixth Embodiment

A description has been provided above for an example in which a protective substrate 14 is made to have a high refractive index, but a high refractive index layer 12 may be formed on an upper surface of the protective substrate 14.

Figure 13:
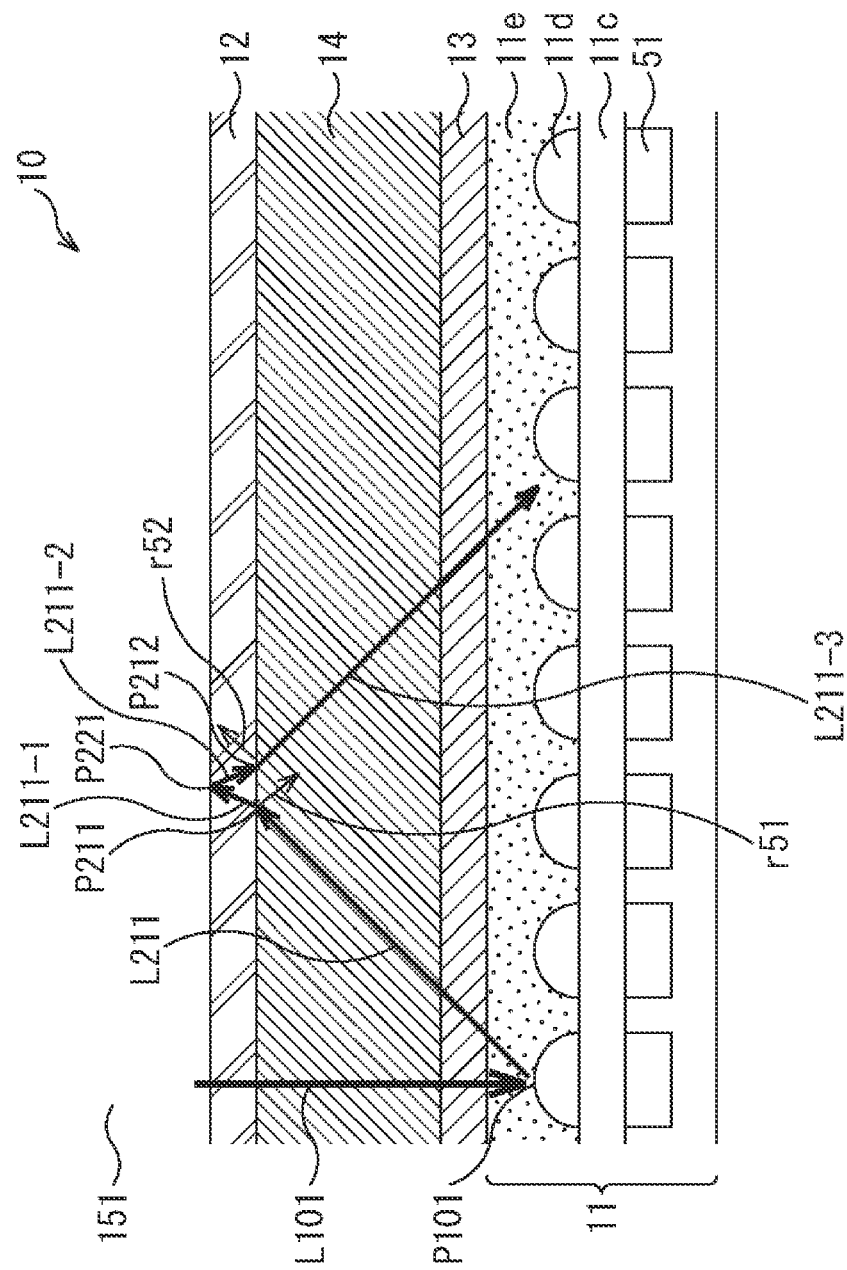
FIG. 13 is a view to describe an exemplary configuration of a sixth embodiment of an integrated portion of the present disclosure.

FIG. 13 illustrates a side cross-section of an integrated portion 10 in which the high refractive index layer 12 is formed on the upper surface of the protective substrate 14. That is, in the integrated portion 10 of FIG. 13, the high refractive index layer 12 is formed on the protective substrate 14.

Here, consideration is given with reference to FIG. 13 for reflected light L211 having a reflection angle larger than a critical angle out of reflected light of incident light L101 reflected at a position P101 of an on-chip lens 11d.

In this case, when the reflected light L211 passes through a flattening film 11e, a bonding resin 13, and the protective substrate 14, the reflected light L211 is partly reflected as reflected light r51 as indicated by an arrow at a position P211 in a boundary between the protective substrate 14 and the high refractive index layer 12. Therefore, reflected light L211-1 having a light amount that has been reduced by an amount of the reflected light r51 from the reflected light L211 passes through the high refractive index layer 12.

Furthermore, the reflected light L211-1 passes through the high refractive index layer 12 and entirely reflected as indicated by an arrow at a position P221 in a boundary between the high refractive index layer 12 and an air layer 151, and passes through again the high refractive index layer 12 as reflected light L211-2.

Furthermore, when the reflected light L211-2 passes through the high refractive index layer 12, the reflected light L211-2 is partly reflected as reflected light r52 as indicated by an arrow at a position P212 in the boundary between the high refractive index layer 12 and the protective substrate 14. Therefore, reflected light L211-3 having a light amount that has been reduced by an amount of the reflected light r52 from the reflected light L211-2 passes through the protective substrate 14, the bonding resin 13, and the flattening film 11e and is incident again on the on-chip lens 11d.

That is, since the reflected light L211 is sequentially and partly reflected as the rays of the reflected light r51 and r52 at the respective positions P211 and P212, the amount of the reflected light L211 is gradually reduced and incident again on the on-chip lens 11d as the reflected light L211-3.

As a result, in the integrated portion 10 of FIG. 13, the reflected light L211-3 incident again on the solid-state imaging element 11 is to be incident again in a state in which the light amount is sufficiently reduced from the reflected light L211, and therefore, generation of flare is suppressed.

Furthermore, since the high refractive index layer 12 has a single-layer structure in the integrated portion 10 of FIG. 13, man-hours for manufacturing is more reduced than that of a wavelength control layer or the like having a lamination structure, and therefore, it is possible to further reduce a manufacturing cost.

7. Seventh Embodiment

In the above, a lens group 16 is provided in a prior stage in a light incident direction in an integrated portion 10, but a part of a final stage of the lens group 16 may be pasted to the integrated portion 10.

Figure 14:
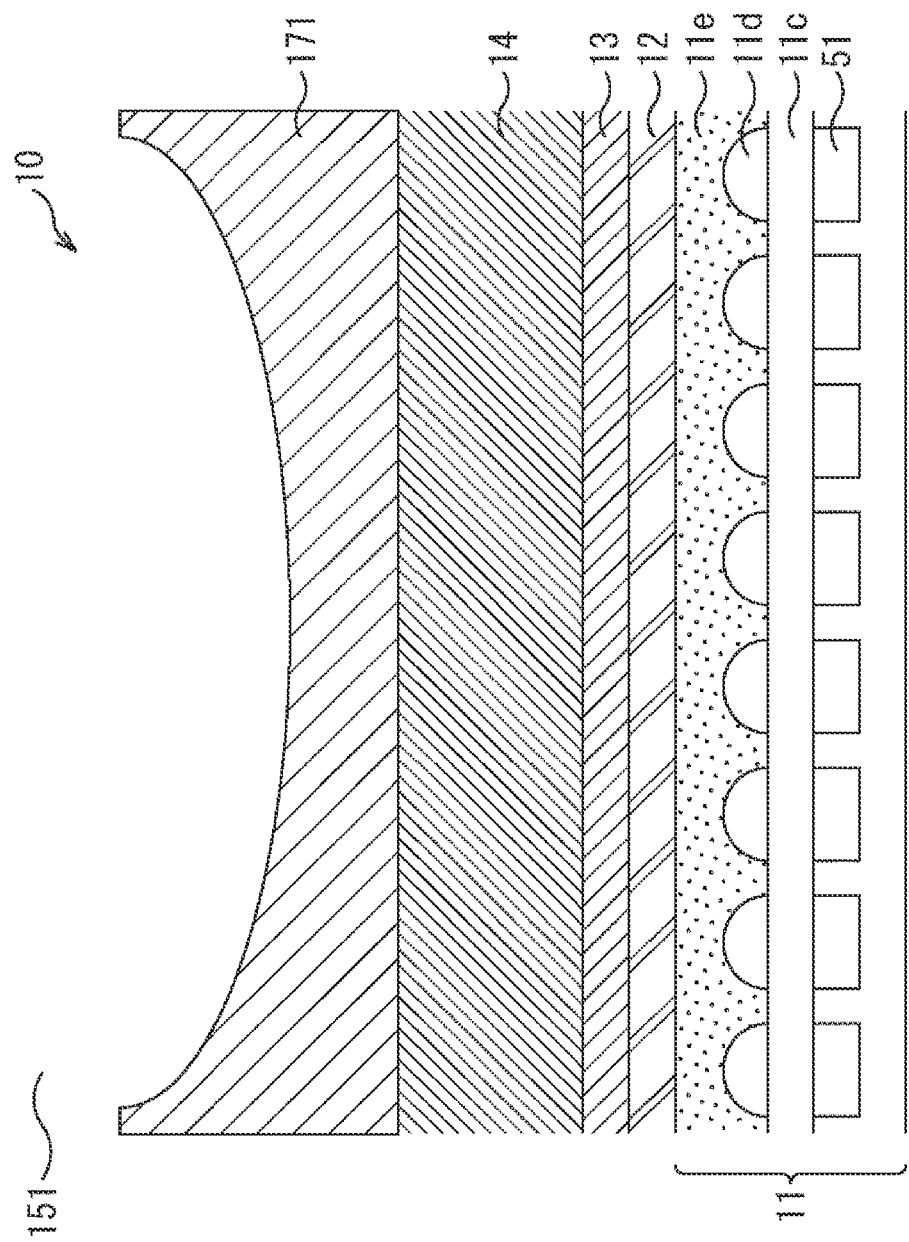
FIG. 14 is a view to describe an exemplary configuration of a seventh embodiment of an integrated portion of the present disclosure.

FIG. 14 is an exemplary configuration of the integrated portion 10 to which a part of the final stage of the lens group 16 is pasted.

That is, FIG. 14 illustrates a configuration in which a lens 171 in the final stage of the lens group 16 is pasted to the integrated portion 10 that has been described with reference to FIG. 8.

In the integrated portion 10 of FIG. 14, generation of flare is also suppressed in a manner similar to the integrated portion 10 of FIG. 8.

Furthermore, since a high refractive index layer 12 has a single-layer structure in the integrated portion 10 of FIG. 13, man-hours for manufacturing is more reduced than that of a wavelength control layer or the like, and therefore, it is possible to further reduce a manufacturing cost.

Moreover, weight of the lens group 16 can be reduced by pasting the part of the lens group 16 onto the integrated portion 10, and therefore, autofocusing can be speeded up due to reduction in a load of an actuator 18.

Note that, the example in which the lens 171 is pasted to the integrated portion 10 of FIG. 8 has been described in FIG. 14, but the lens 171 may be formed on another integrated portions 10 other than this integrated portion 10, and the lens 171 may be formed on any one of, for example, the integrated portions of FIGS. 9 to 13. Furthermore, a shape of the lens 171 may be a concave lens as illustrated in FIG. 14, may be a convex lens, or may be a combination of a concave lens and a convex lens.

8. Exemplary Application to Electronic Apparatus

An imaging device 1 in FIG. 1 including one of the integrated portions 10 of FIGS. 8 to 14 described above can be applied to an imaging device such as a digital still camera, a digital video camera, and the like, a mobile phone having an imaging function, or various kinds of electronic apparatuses such as other apparatuses each including an imaging function.

Figure 15:
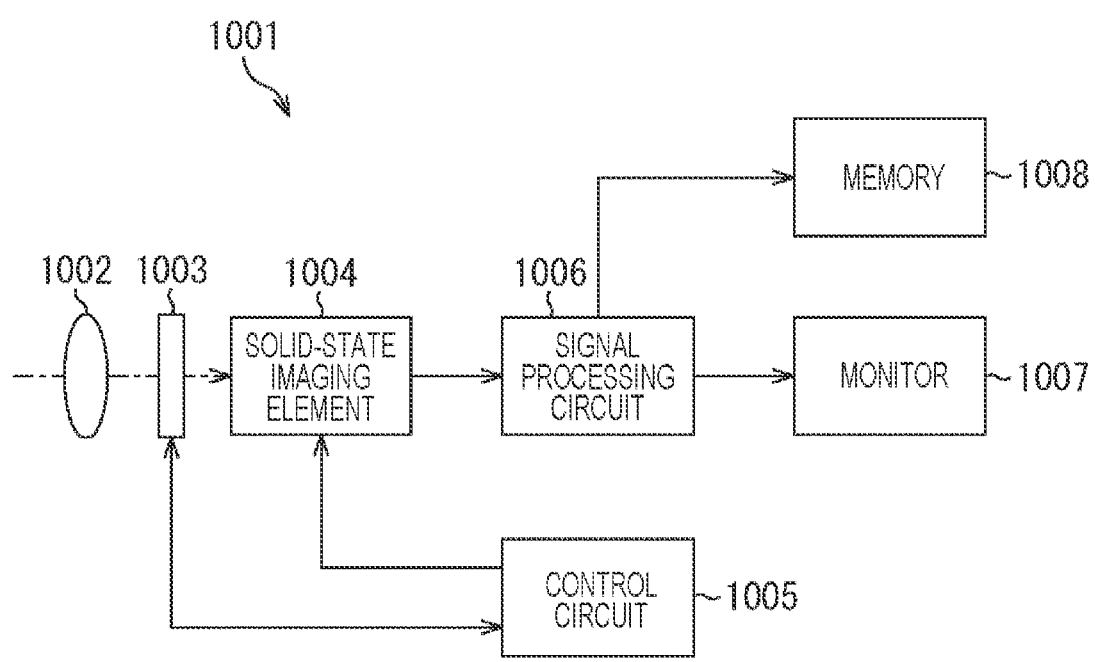
FIG. 15 is a block diagram illustrating an exemplary configuration of an imaging device as an electronic apparatus to which a camera module of the present disclosure is applied.

FIG. 15 is a block diagram illustrating an exemplary configuration of an imaging device as an electronic apparatus to which the present technology is applied.

An imaging device 1001 illustrated in FIG. 15 has a configuration including an optical system 1002, a shutter device 1003, a solid-state imaging element 1004, a drive circuit 1005, a signal processing circuit 1006, a monitor 1007, and a memory 1008, and is capable of capturing a still image and a moving image.

The optical system 1002 includes one or a plurality of lenses, guides light (incident light) from a subject to the solid-state imaging element 1004, and forms an image on a light receiving surface of the solid-state imaging element 1004.

The shutter device 1003 is arranged between the optical system 1002 and the solid-state imaging element 1004, and controls a light emission period and a light shielding period relative to the solid-state imaging element 1004 in accordance with control of the drive circuit 1005.

The solid-state imaging element 1004 includes a package including the above-described solid-state imaging element. The solid-state imaging element 1004 accumulates signal electric charge for a certain period in accordance with light from which an image is formed on the light receiving surface via the optical system 1002 and the shutter device 1003. The signal electric charge accumulated in the solid-state imaging element 1004 is transferred in accordance with a drive signal (timing signal) supplied from the drive circuit 1005.

The drive circuit 1005 outputs a drive signal that controls transfer operation of the solid-state imaging element 1004 and shutter operation of the shutter device 1003, and drives the solid-state imaging element 1004 and the shutter device 1003.

The signal processing circuit 1006 applies various kinds of signal processing to signal electric charge output from the solid-state imaging element 1004. An image (image data)

obtained by the signal processing circuit 1006 applying the signal processing is supplied and displayed on the monitor 1007 or supplied and stored (recorded) in the memory 1008.

In the imaging device 1001 having such a configuration, it is possible to suppress flare caused by internal irregular reflection and coloring caused by the flare can be suppressed while achieving reduction in a size and a height of the device configuration by applying the imaging device 1 including the integrated portion 10 of one of FIGS. 8 to 14 instead of the above-described optical system 1002 and the solid-state imaging element 1004.

9. Exemplary Uses of Solid-State Imaging Device

Figure 16:
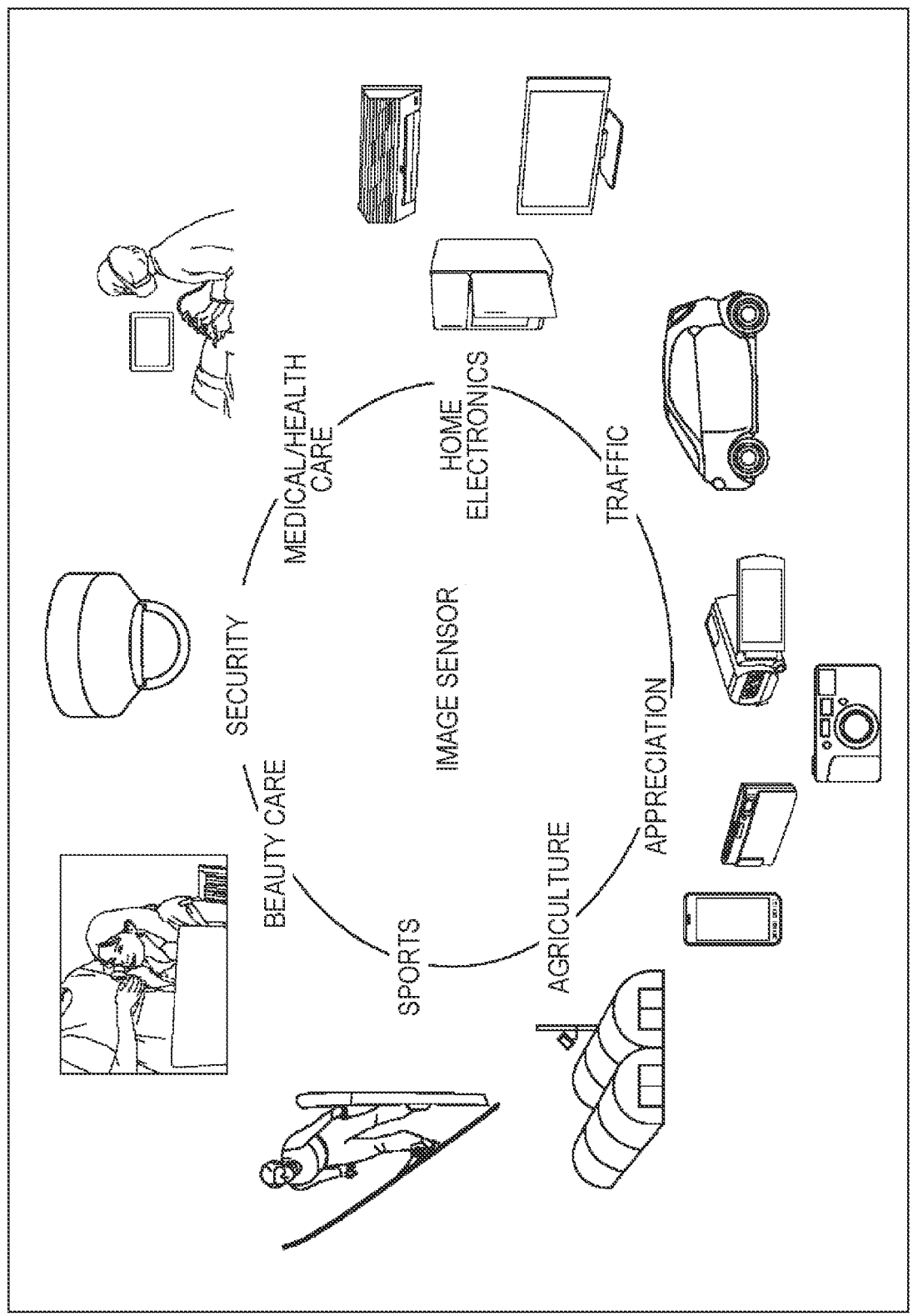
FIG. 16 is a diagram illustrating exemplary uses of the camera module to which the present disclosure is applied.

FIG. 16 is a diagram illustrating exemplary uses in which the imaging device 1 described above is used.

For example, the above-described imaging device 1 can be used in various cases of sensing light such as visible light, infrared light, ultraviolet light, X-rays, and the like as described below.

- Device adapted to capture an image provided for image viewing, such as a digital camera, a portable device or the like incorporated with a camera function
- Device provided for traffic in order to achieve safety operation such as automatic stop and the like, recognition of a state of a vehicle operator or the like, such as a device including an on-vehicle sensor that captures images of a front side, a rear side, a periphery of a vehicle, a vehicle interior, and the like, a monitoring camera that monitors a traveling vehicle and a road, a ranging sensor that measures an inter-vehicle distance, etc., and the like
- Device provided for home electronics such as a television, a refrigerator, an air conditioner, and the like in order to capture images of gestures of a user and operate these electric appliances in accordance with the gestures
- Device provided for medical and health care, such as an endoscope, a device that captures images of blood vessels by receiving infrared light, or the like
- Device provided for security, such as a monitoring camera for crime prevention, a camera for person authentication, or the like
- Device provided for beauty care, such as a skin measurement instrument that captures an image of skin, a microscope that captures an image of scalp, or the like
- Device provided for sports, such as an action camera, a wearable camera used for sports, or the like
- Device provided for agriculture, such as a camera to monitor states of fields and crops, or the like.

10. Exemplary Application to Endoscopic Surgery System

The technology according to the present disclosure (the present technology) is applicable to various products. For example, the technology according to the present disclosure may be applied to an endoscopic surgery system.

Figure 17:
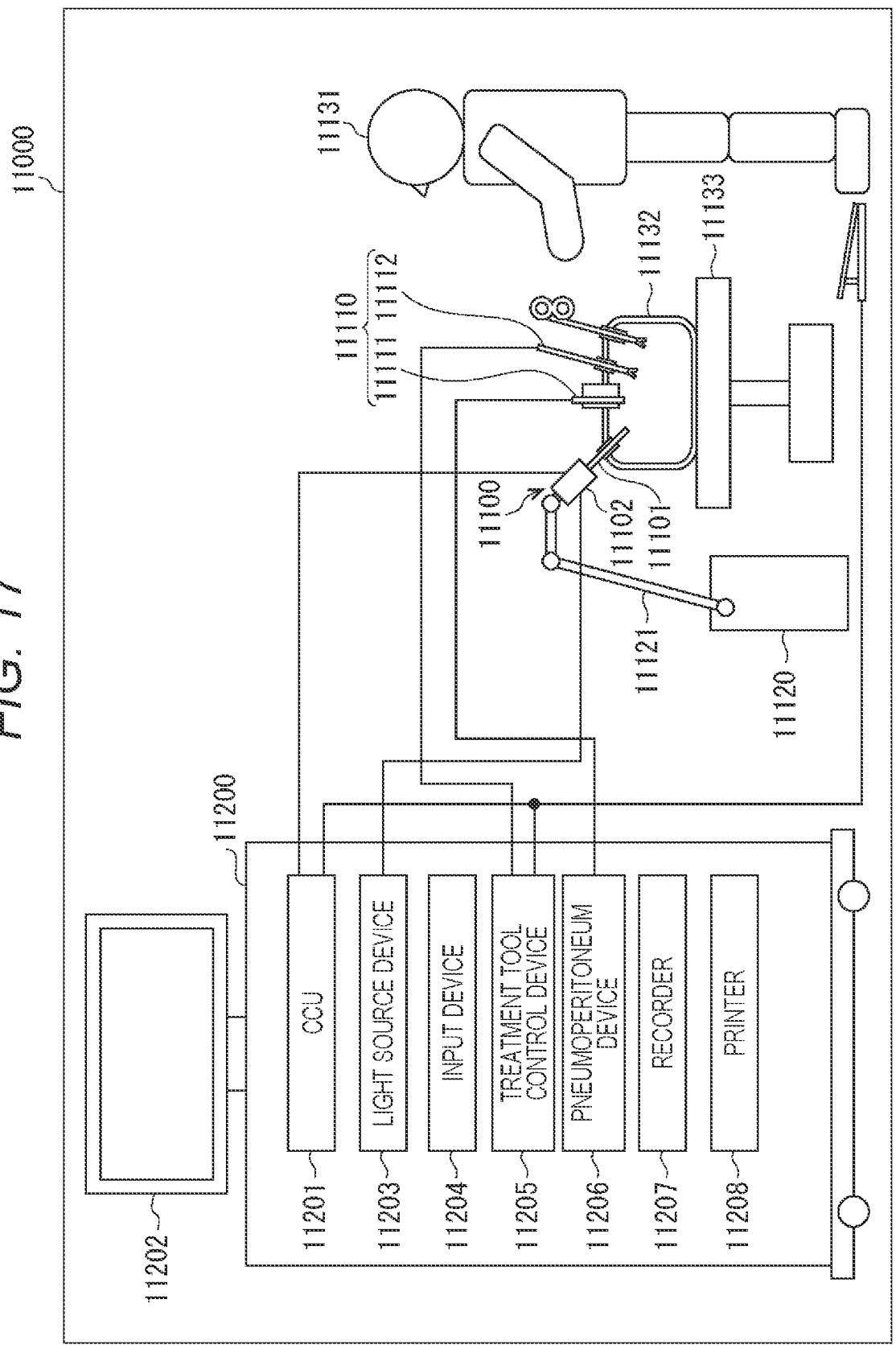
FIG. 17 is a diagram illustrating an exemplary schematic configuration of an endoscopic surgery system.

FIG. 17 is a diagram illustrating an exemplary schematic configuration of an endoscopic surgery system to which the technology according to the present disclosure (the present technology) can be applied.

FIG. 17 illustrates a state in which an operator (surgeon) 11131 is performing surgery for a patient 11132 on a patient bed 11133 by using an endoscopic surgery system 11000. As illustrated in the drawing, the endoscopic surgery system 11000 includes an endoscope 11100, other surgical tools 11110 such as a pneumoperitoneum tube 11111, an energy treatment tool 11112, and the like, a support arm device 11120 supporting the endoscope 11100, and a cart 11200 on which various devices for endoscopic surgery are mounted.

The endoscope 11100 includes a lens barrel 11101 and a camera head 11102 connected to a proximal end of the lens barrel 11101, and a predetermined length from a distal end of the lens barrel 11101 is to be inserted into a body cavity of the patient 11132. In the illustrated example, the endoscope 11100 provided as a so-called rigid mirror including the rigid lens barrel 11101 is illustrated, but the endoscope 11100 may also be provided as a so-called flexible mirror including a flexible lens barrel.

The distal end of the lens barrel 11101 is provided with an open portion into which an objective lens is fitted. The endoscope 11100 has a light source device 11203 connected, and light generated by the light source device 11203 is guided to the distal end of the lens barrel by a light guide provided in a manner extending inside the lens barrel 11101, and the light is emitted to an observation target inside the body cavity of the patient 11132 via the objective lens. Note that the endoscope 11100 may be a forward-viewing endoscope, an oblique-viewing endoscope, or side-viewing endoscope.

An optical system and an imaging element are provided inside the camera head 11102, and reflected light (observation light) from the observation target is condensed into the imaging element by the optical system. The observation light is photoelectrically converted by the imaging element, and an electric signal corresponding to the observation light, that is, an image signal corresponding to an observation image is generated. The image signal is transmitted to a camera control unit (CCU) 11201 as RAW data.

The CCU 11201 includes a central processing unit (CPU), a graphics processing unit (GPU), and the like, and integrally controls operation of the endoscope 11100 and a display device 11202. Moreover, the CCU 11201 receives an image signal from the camera head 11102 and applies, to the image signal, various kinds of image processing, such as development processing (demosaic processing) and the like, in order to display an image based on the image signal.

The display device 11202 displays the image based on the image signal applied with the image processing by the CCU 11201 under the control of the CCU 11201.

The light source device 11203 includes a light source such as a light emitting diode (LED) or the like, and supplies the endoscope 11100 with irradiation light at the time of capturing an image of a surgical site or the like.

An input device 11204 is an input interface for the endoscopic surgery system 11000. A user can input various kinds of information and can input a command to the endoscopic surgery system 11000 via the input device 11204. For example, the user inputs a command to change imaging conditions by the endoscope 11100 (a kind of irradiation light, a magnification, a focal length, and the like).

A treatment tool control device 11205 controls drive of the energy treatment tool 11112 for ablation of tissue, incision, sealing of a blood vessel, and the like. A pneumoperitoneum device 11206 feeds a gas into the body cavity via the pneumoperitoneum tube 11111 in order to inflate the body cavity of the patient 11132 for the purpose of securing a field of view by the endoscope 11100 and securing a work space for an operator. A recorder 11207 is a device that can record various kinds of information related to surgery. A printer 11208 is a device that can print various kinds of information related to surgery in various formats such as text, an image, a graph, and the like.

Note that the light source device 11203 that supplies the endoscope 11100 with the irradiation light at the time of capturing an image of a surgical site can include, for example, an LED, a laser light source, or a white light source including a combination thereof. In a case where the white light source includes a combination with RGB laser light sources, it is possible to control output intensity and output timing of respective colors (respective wavelengths) with high accuracy, and therefore, white balance of a captured image can be adjusted in the light source device 11203. Furthermore, in this case, images corresponding to the respective RGB can also be captured in a time sharing manner by: irradiating an observation target with rays of laser light from the respective RGB laser light sources in a time sharing manner; and controlling drive of the imaging element of the camera head 11102 in synchronization with irradiation timing thereof. According to this method, a color image can be obtained without providing a color filter in the imaging element.

Furthermore, drive of the light source device 11203 may be controlled so as to change, at predetermined time intervals, the intensity of the light to be output. Since images are acquired in the time sharing manner by controlling the drive of the imaging element of the camera head 11102 in synchronization with the timing of changing the intensity of the light and then the images are synthesized, it is possible to generate an image of a so-called high dynamic range without underexposure and overexposure.

Furthermore, the light source device 11203 may be capable of supplying light of a predetermined wavelength band suitable for special light observation. In the special light observation, for example, a so-called narrow band imaging is performed, in which an image of predetermined tissue such as a blood vessel of a mucosal surface layer or the like is captured with high contrast by emitting light of a narrower band than that of irradiation light at the time of normal observation (that is, white light) while utilizing wavelength dependency of light absorption in a body tissue. Alternatively, in the special light observation, fluorescence observation in which an image is obtained by fluorescence generated by emitting excitation light may be performed. In the fluorescence observation, it is possible to: perform observation on fluorescence from a body tissue by irradiating the body tissue with the excitation light (auto-fluorescence observation); or obtain a fluorescence image by locally injecting a reagent such as indocyanine green (ICG) or the like into the body tissue and also irradiating the body tissue with excitation light corresponding to a fluorescence wavelength of the reagent. The light source device 11203 may be capable of supplying the narrow band light and/or the excitation light suitable for such special light observation.

Figure 18:
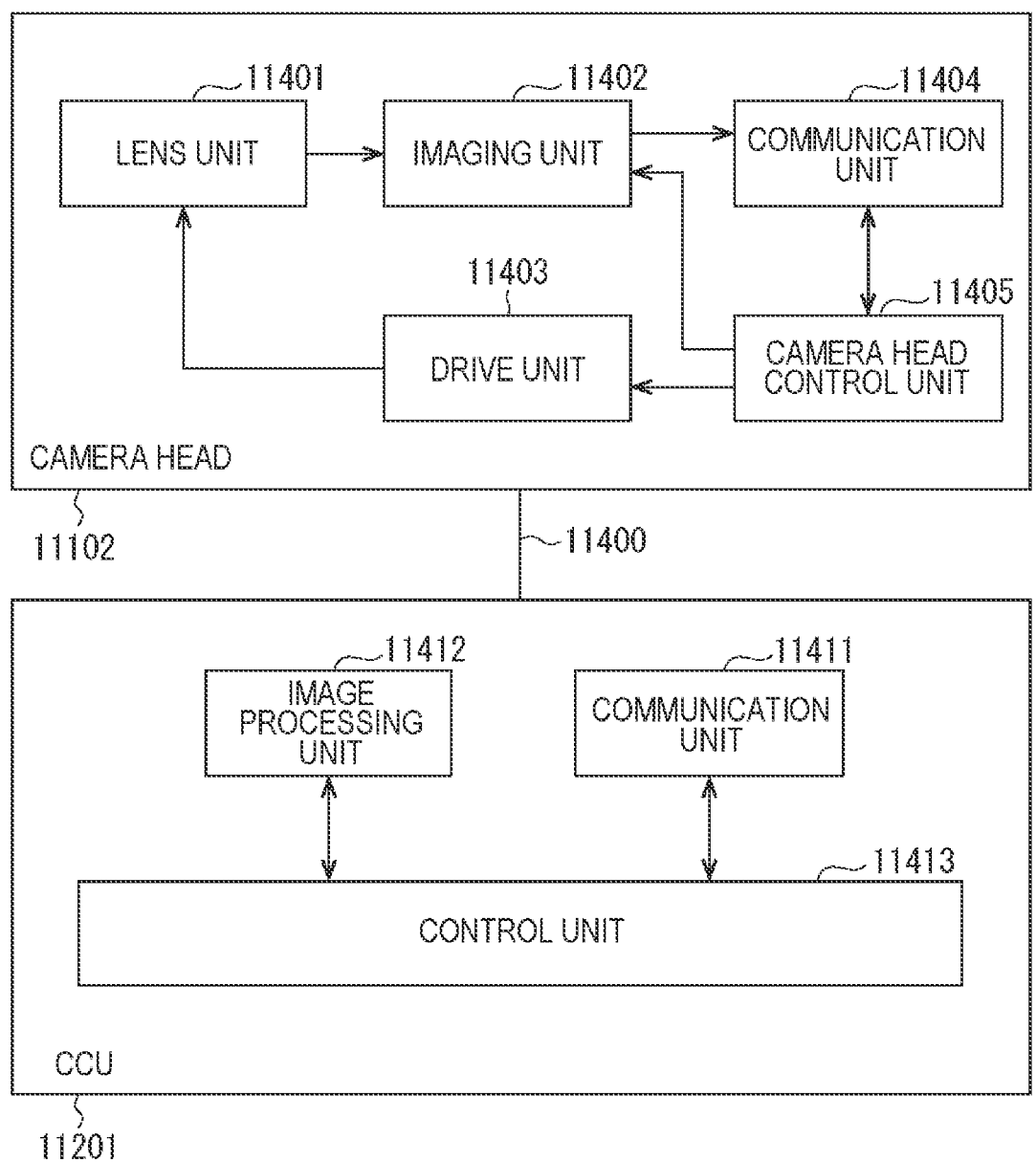
FIG. 18 is a block diagram illustrating exemplary functional configurations of a camera head and a CCU.

FIG. 18 is a block diagram illustrating exemplary functional configurations of the camera head 11102 and the CCU 11201 illustrated in FIG. 17.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are connected in a manner communicable with each other by a transmission cable 11400.

The lens unit 11401 is an optical system provided at a connecting portion with the lens barrel 11101. The observation light taken in from the distal end of the lens barrel 11101 is guided to the camera head 11102 and incident on the lens unit 11401. The lens unit 11401 is formed by combining a plurality of lenses including a zoom lens and a focus lens.

The imaging unit 11402 includes an imaging element. The number of imaging elements constituting the imaging unit 11402 may be one (a so-called single-plate type) or plural (a so-called multi-plate type). In a case where the imaging unit 11402 has a multi-plate type configuration, for example, image signals corresponding to the respective RGB may be generated by the respective imaging elements, and a color image may be obtained by synthesizing these image signals. Alternatively, the imaging unit 11402 may include a pair of imaging elements in order to acquire respective image signals for a right eye and a left eye, in which the image signals are adaptable to three-dimensional (3D) display. The operator 11131 can grasp more correctly a depth of a living tissue in a surgical site by performing the 3D display. Note that, in a case where the imaging unit 11402 has the multi-plate type configuration, a plurality of systems of lens units 11401 can be also provided in a manner corresponding to the respective imaging elements.

Furthermore, the imaging unit 11402 is not necessarily provided in the camera head 11102. For example, the imaging unit 11402 may be provided immediately behind the objective lens inside the lens barrel 11101.

The drive unit 11403 includes an actuator, and moves a zoom lens and a focus lens of the lens unit 11401 by a predetermined distance along an optical axis under control of the camera head control unit 11405. Therefore, a magnification and a focal point of an image captured by the imaging unit 11402 can be adjusted as appropriate.

The communication unit 11404 includes a communication device in order to exchange various kinds of information with the CCU 11201. The communication unit 11404 transmits, as RAW data, an image signal obtained from the imaging unit 11402 to the CCU 11201 via the transmission cable 11400.

Furthermore, the communication unit 11404 receives, from the CCU 11201, a control signal in order to control the drive of the camera head 11102, and supplies the control signal to the camera head control unit 11405. The control signal includes information associated with imaging conditions including, for example, information indicating designation of a frame rate of a captured image, information indicating designation of an exposure value at the time of imaging, information indicating designation of a magnification and a focal point of a captured image, and/or the like.

Note that the above-described imaging conditions such as the frame rate, the exposure value, the magnification, the focal point, and the like may be designated as appropriate by a user, or may be automatically set by the control unit 11413 of the CCU 11201 on the basis of an acquired image signal. In the latter case, a so-called auto exposure (AE) function, an auto focus (AF) function, and an auto white balance (AWB) function are mounted on the endoscope 11100.

The camera head control unit 11405 controls the drive of the camera head 11102 on the basis of a control signal from the CCU 11201 received via the communication unit 11404.

The communication unit 11411 includes a communication device to exchange various kinds of information with the camera head 11102. The communication unit 11411 receives an image signal transmitted from the camera head 11102 via the transmission cable 11400.

Furthermore, the communication unit 11411 transmits a control signal in order to control the drive of the camera head 11102 to the camera head 11102. The image signal and the control signal can be transmitted by electric communication, optical communication, and the like.

The image processing unit 11412 applies various kinds of image processing to the image signal that is RAW data transmitted from the camera head 11102.

The control unit 11413 performs various kinds of control associated with capturing an image of a surgical site or the like by the endoscope 11100 and display of a captured image obtained by capturing the image of the surgical site or the like. For example, the control unit 11413 generates a control signal in order to control the drive of the camera head 11102.

Furthermore, the control unit 11413 causes, on the basis of an image signal applied with the image processing by the image processing unit 11412, the display device 11202 to display a captured image on which a surgical site or the like is included. At this time, the control unit 11413 may recognize various objects inside the captured image by using various image recognition technologies. For example, the control unit 11413 can recognize a surgical tool such as forceps and the like, a specific living body part, bleeding, a mist at the time of using the energy treatment tool 11112, and the like by detecting an edge shape, a color, and the like of an object included in the captured image. When the control unit 11413 causes the display device 11202 to display the captured image, the control unit 11413 may cause the display device 11202 to display various kinds of surgical assistance information in a manner superimposed on the image of the surgical site by using the recognition results. Since the surgical assistance information is displayed in the superimposed manner and presented to the operator 11131, it is possible to reduce a burden on the operator 11131 and the operator 11131 can surely perform the surgery.

The transmission cable 11400 that connects the camera head 11102 and the CCU 11201 is an electric signal cable adaptable to electric signal communication, an optical fiber adaptable to optical communication, or a composite cable thereof.

Here, in the illustrated example, communication is performed by wire using the transmission cable 11400, but the communication between the camera head 11102 and the CCU 11201 may also be performed wirelessly.

In the above, the description has been provided for the example of the endoscopic surgery system to which the technology according to the present disclosure can be applied. The technology according to the present disclosure can be applied to, for example, the endoscope 11100, the camera head 11102 (imaging unit 11402), the CCU 11201 (image processing unit 11412), and the like among the configurations described above. Specifically, for example, an imaging device 1 of FIG. 1 provided with the integrated portion 10 of any one of FIGS. 8 to 14 can be applied to the lens unit 11401 and the imaging unit 10402. With application of the technology according to the present disclosure to the lens unit 11401 and the imaging unit 10402, it is possible to reduce a size and a height of the device configuration, and also flare caused by internal irregular reflection and coloring caused by the flare can be suppressed.

Note that the endoscopic surgery system has been described as an example here, but the technology according to the present disclosure may also be applied to, for example, a microscopic surgery system and the like.

11. Exemplary Application to Mobile Object

The technology according to the present disclosure (the present technology) is applicable to various products. For example, the technology according to the present disclosure may be implemented as a device mounted on any kind of mobile objects such as a car, an electric car, a hybrid electric car, a motorcycle, a bicycle, a personal mobility, an airplane, a drone, a ship, a robot, and the like.

Figure 19:
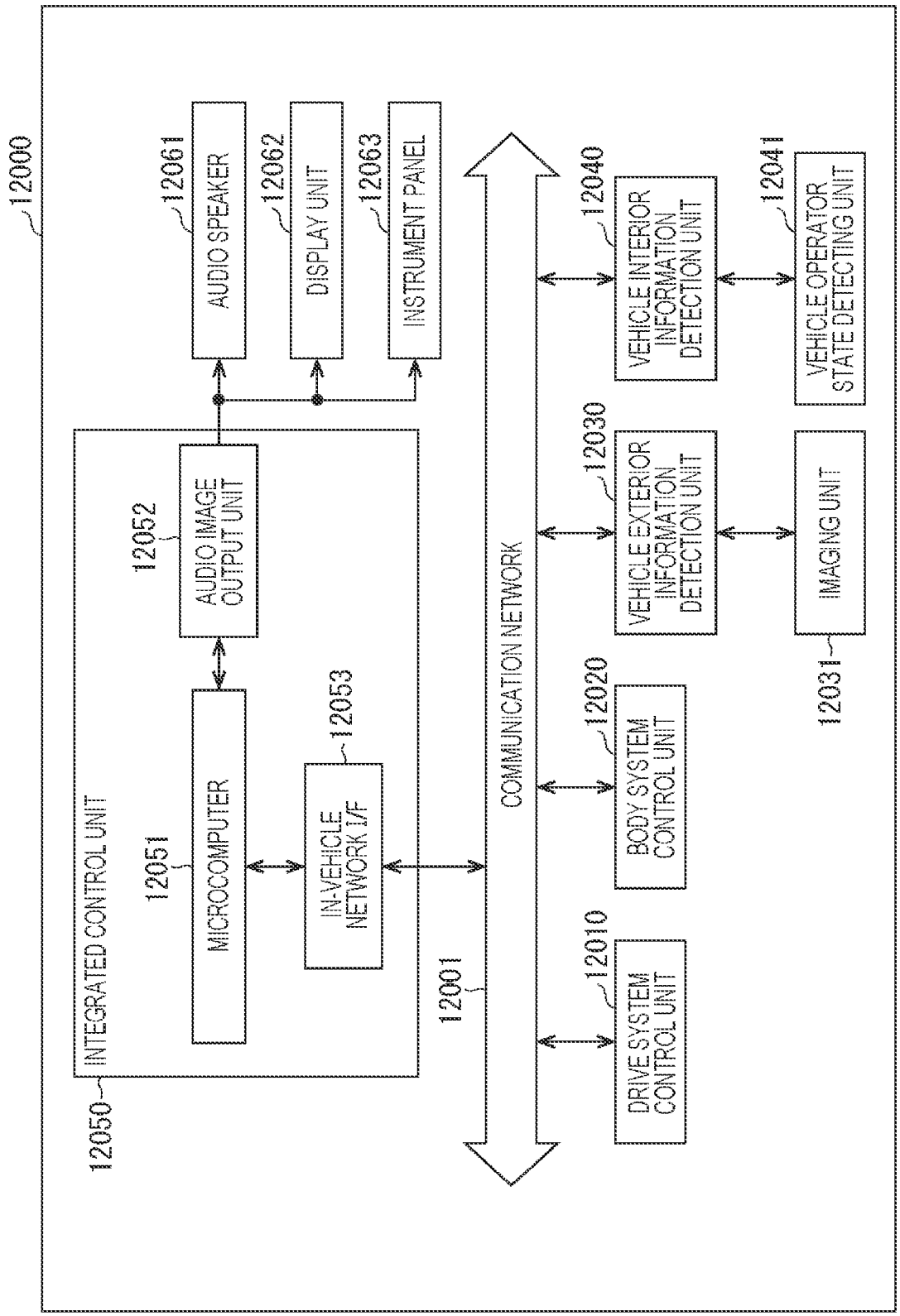
FIG. 19 is a block diagram illustrating an exemplary schematic configuration of a vehicle control system.

FIG. 19 is a block diagram illustrating an exemplary schematic configuration of a vehicle control system that is an example of a mobile object control system to which the technology according to the present disclosure can be applied.

A vehicle control system 12000 includes a plurality of electronic control units connected via a communication network 12001. In the example illustrated in FIG. 19, the vehicle control system 12000 includes a drive system control unit 12010, a body system control unit 12020, a vehicle exterior information detection unit 12030, a vehicle interior information detection unit 12040, and an integrated control unit 12050. Furthermore, a microcomputer 12051, an audio image output unit 12052, and an in-vehicle network interface (I/F) 12053 are illustrated as functional configurations of the integrated control unit 12050.

The drive system control unit 12010 controls operation of devices associated with a drive system of a vehicle in accordance with various programs. For example, the drive system control unit 12010 functions as a control device for: a drive force generating device to generate drive force of a vehicle, such as an internal combustion engine or a drive motor; a drive force transmission mechanism to transmit the driving force to wheels; a steering mechanism that adjusts a rudder angle of a vehicle; a brake device that generates braking force of a vehicle; and the like.

The body system control unit 12020 controls operation of various devices equipped on a vehicle body in accordance with various programs. For example, the body system control unit 12020 functions as a control device for: a keyless entry system; a smart key system; a power window device; or various kinds of lamps such as a headlamp, a back lamp, a brake lamp, a turn indicator, a fog lamp, and the like. In this case, radio waves transmitted from a portable machine substituted for a key, or signals of various switches can be received in the body system control unit 12020. The body system control unit 12020 accepts these radio waves or signals and controls a door lock device, a power window device, a lamp, and the like of a vehicle.

The vehicle exterior information detection unit 12030 detects information associated with the outside of the vehicle having the vehicle control system 12000 mounted thereon. For example, the vehicle exterior information detection unit 12030 has an imaging unit 12031 connected thereto. The vehicle exterior information detection unit 12030 causes the imaging unit 12031 to capture an image of the outside of the vehicle, and receives the captured image. The vehicle exterior information detection unit 12030 may perform, on the basis of the received image, object detection processing or distance detection processing for a person, a vehicle, an obstacle, a sign, characters on a road surface, and the like.

The imaging unit 12031 is an optical sensor that receives light and outputs an electric signal corresponding to a received amount of the light. The imaging unit 12031 can output an electric signal as an image and can also output an electric signal as ranging information. Furthermore, the light received by the imaging unit 12031 may be visible light or may be invisible light such as infrared rays or the like.

The vehicle interior information detection unit 12040 detects information associated with the inside of the vehicle. For example, the vehicle interior information detection unit 12040 is connected to a vehicle operator state detecting unit 12041 that detects a state of a vehicle operator. The vehicle operator state detecting unit 12041 includes, for example, a camera that captures images of the vehicle operator, and the vehicle interior information detection unit 12040 may evaluate a degree of fatigue or a degree of concentration of the vehicle operator on the basis of the detection information received from the vehicle operator state detecting unit 12041, or may discriminate whether or not the vehicle operator is dozing off.

The microcomputer 12051 calculates a control target value for the drive force generating device, the steering mechanism, or the brake device on the basis of information associated with the inside or the outside of the vehicle acquired by the vehicle exterior information detection unit 12030 or the vehicle interior information detection unit 12040, and can output a control command to the drive system control unit 12010. For example, the microcomputer 12051 can perform cooperative control intended to implement functions of an advanced driver assistance system (ADAS) including: collision avoidance or impact mitigation of a vehicle; adaptive cruise based on an inter-vehicle distance; speed maintaining cruise; vehicle collision warning or vehicle lane departure warning; and the like.

Furthermore, the microcomputer 12051 controls the drive force generating device, the steering mechanism, the brake device, or the like on the basis of information associated with a periphery of the vehicle acquired by the vehicle exterior information detection unit 12030 or the vehicle interior information detection unit 12040, thereby achieving cooperative control intended to perform automated cruise and the like in which autonomous travel is performed without depending on operation by a vehicle operator.

Furthermore, the microcomputer 12051 can output a control command to the body system control unit 12020 on the basis of the vehicle exterior information acquired in the vehicle exterior information detection unit 12030. For example, the microcomputer 12051 controls a headlamp in accordance with a position of a preceding vehicle or an oncoming vehicle detected by the vehicle exterior information detection unit 12030, and can perform cooperative control intended to perform an anti-dazzling such as switching a high beam to a low beam, and the like.

The audio image output unit 12052 transmits at least one of an audio output signal or an image output signal to an output device capable of visually or audibly notifying a passenger of a vehicle or the outside of the vehicle of information. In the example of FIG. 19, an audio speaker 12061, a display unit 12062, and an instrument panel 12063 are exemplified as the output devices. The display unit 12062 may include at least one of an on-board display or a head-up display, for example.

Figure 20:
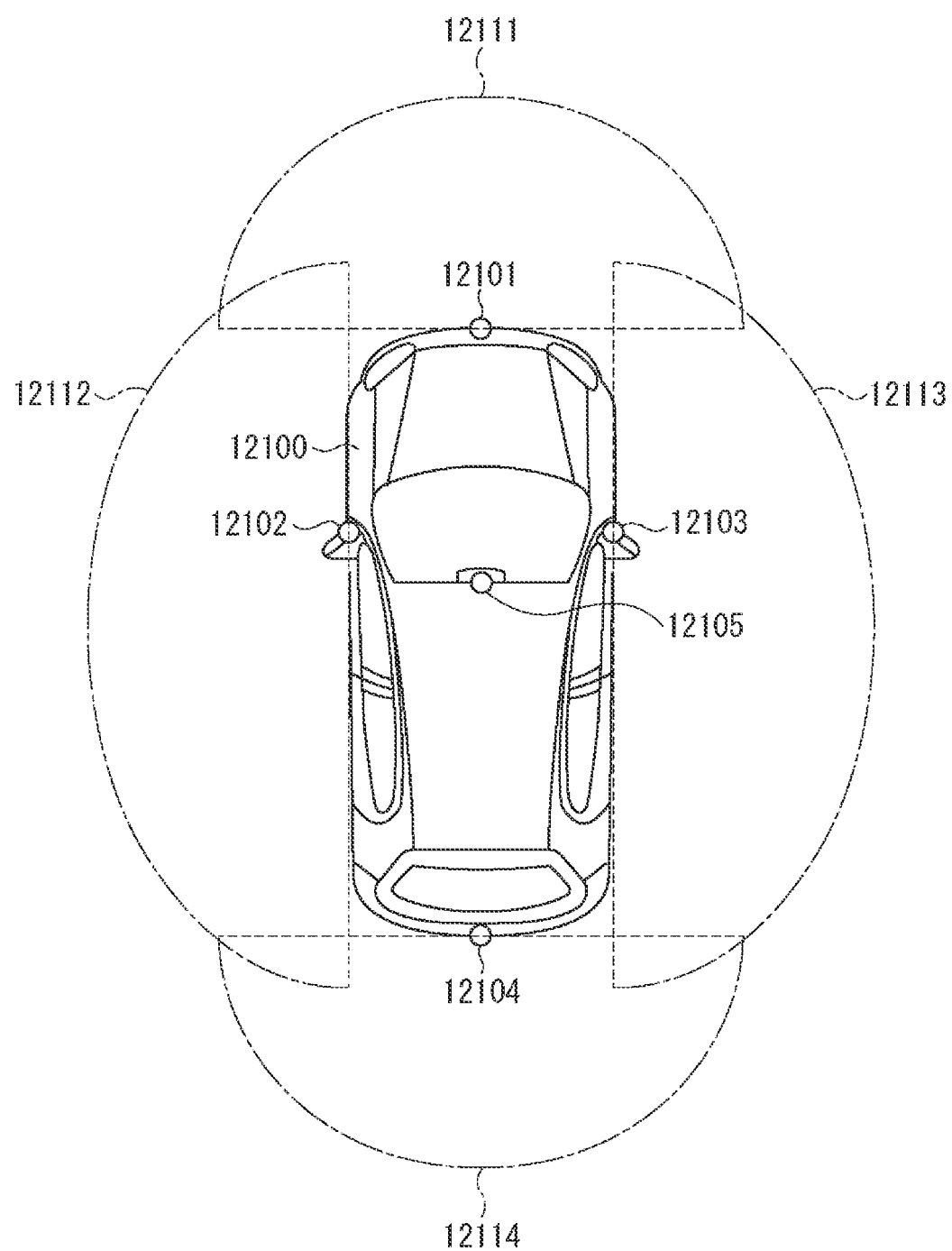
FIG. 20 is an explanatory diagram illustrating exemplary installation positions of a vehicle exterior information detecting unit and an imaging unit.

FIG. 20 is a diagram illustrating exemplary installation positions of the imaging units 12031.

In FIG. 20, a vehicle 12100 includes imaging units 12101, 12102, 12103, 12104, and 12105 as the imaging units 12031.

For example, the imaging units 12101, 12102, 12103, 12104, and 12105 are provided at positions such as a front nose, a side mirror, a rear bumper, a back door, an upper portion of a front windshield inside a vehicle interior of the vehicle 12100, and the like. The imaging unit 12101 provided at the front nose and the imaging unit 12105 provided at the upper portion of the front windshield inside the vehicle interior mainly acquire images in front of the vehicle 12100. The imaging units 12102 and 12103 provided at the side mirrors mainly acquire images of lateral sides of the vehicle 12100. The imaging unit 12104 provided at the rear bumper or the back door mainly acquires an image behind the vehicle 12100. The front images acquired by the imaging units 12101 and 12105 are mainly used to detect a preceding vehicle, a pedestrian, an obstacle, a traffic signal, a traffic sign, a lane, or the like.

Note that FIG. 20 illustrates exemplary imaging ranges of the imaging units 12101 to 12104. An imaging range 12111 indicates an imaging range of the imaging unit 12101 provided at the front nose, imaging ranges 12112 and 12113 indicate imaging ranges of the imaging units 12102 and 12103 provided at the respective side mirrors, and an imaging range 12114 indicates an imaging range of the imaging unit 12104 provided at the rear bumper or the back door. For example, an overhead view image of the vehicle 12100 viewed from above can be obtained by overlapping pieces of image data captured by the imaging units 12101 to 12104.

At least one of the imaging units 12101 to 12104 may have a function of acquiring distance information. For example, at least one of the imaging units 12101 to 12104 may be a stereo camera including a plurality of imaging elements, or may be an imaging element including pixels for detecting a phase difference.

For example, the microcomputer 12051 obtains, on the basis of distance information acquired from the imaging units 12101 to 12104: a distance to each of three-dimensional objects within the imaging ranges 12111 to 12114; and a temporal change of the distance (a relative speed with respect to the vehicle 12100), and as a result, it is possible to extract, as a preceding vehicle, a closest three-dimensional object that exists particularly on an advancing route of the vehicle 12100 and also the three-dimensional object that travels at a predetermined speed (e.g., 0 km/h or more) in a direction substantially same as the vehicle 12100. Moreover, the microcomputer 12051 can preliminarily set an inter-vehicle distance to be secured in a front space with a preceding vehicle, and can perform automatic brake control (also including adaptive cruise stop control), automatic acceleration control (also including adaptive cruise start control), and the like. Thus, it is possible to perform cooperative control intended to perform the automated cruise or the like in which autonomous travel is performed without depending on operation of a vehicle operator.

For example, the microcomputer 12051 extracts three-dimensional object data associated with three-dimensional objects while categorizing the three-dimensional objects into: a two-wheeled vehicle; a regular vehicle; a large vehicle; a pedestrian; or another three-dimensional object such as a telephone pole or the like, on the basis of the distance information obtained from the imaging units 12101 to 12104, and can use the extracted data to automatically avoid obstacles. For example, the microcomputer 12051 distinguishes whether an obstacle in the periphery of the vehicle 12100 is an obstacle visible to a vehicle driver of the vehicle 12100 or an obstacle hardly visible to the vehicle driver. Then, the microcomputer 12051 makes a determination on a collision risk indicating a risk level of collision with each obstacle, and when the collision risk is a setting value or more and there is a possibility of collision, the microcomputer 12051 can provide operational assistance in order to avoid the collision by outputting an alarm to the vehicle driver via the audio speaker 12061 and the display unit 12062 or by performing forced deceleration or avoidance steering via the drive system control unit 12010.

At least one of the imaging units 12101 to 12104 may be an infrared camera that detects infrared rays. For example, the microcomputer 12051 can recognize a pedestrian by determining whether or not a pedestrian is included in captured images of the imaging units 12101 to 12104. Such pedestrian recognition is performed by, for example: a procedure of extracting feature points in the captured images of the imaging units 12101 to 12104 provided as the infrared cameras; and a procedure of discriminating whether or not an object is a pedestrian by applying pattern matching processing to a series of feature points indicating an outline of the object. When the microcomputer 12051 determines that a pedestrian is included in the captured images of the imaging units 12101 to 12104 and recognizes the pedestrian, the audio image output unit 12052 controls the display unit 12062 such that the display unit 12062 displays, for emphasis, a rectangular contour line over the recognized pedestrian in a superimposed manner. Furthermore, the audio image output unit 12052 may also control the display unit 12062 such that the display unit 12062 displays an icon or the like indicating the pedestrian at a desired position.

The exemplary vehicle control system to which the technology according to the present disclosure can be applied has been described above. The technology according to the present disclosure can be applied to, for example, the imaging unit 12031 among the configurations described above.

Specifically, for example, an imaging device 1 of FIG. 1 provided with the integrated portion 10 of any one of FIGS. 8 to 14 can be applied to the imaging unit 12031. With application of the technology according to the present disclosure to the imaging unit 12031, it is possible to reduce a size and a height of the device configuration, and also generation of flare and coloring caused by the flare can be suppressed.

Note that the present disclosure can also adopt the following configurations.

<1> A solid-state imaging device in which a high refractive index layer having a refractive index higher than a refractive index of any one of a transparent protective substrate and a surface layer of an imaging surface of a solid-state imaging element is formed in a prior stage of the solid-state imaging element in a light incident direction.

<2> The solid-state imaging device recited in <1>, in which the high refractive index layer is formed between the transparent protective substrate and the solid-state imaging element.

<3> The solid-state imaging device recited in <2>, in which the high refractive index layer is formed between the solid-state imaging element and a bonding resin layer having a refractive index lower than the refractive index of the high refractive index layer.

<4> The solid-state imaging device recited in <2>, in which the high refractive index layer is formed between the transparent protective substrate and the bonding resin layer having the refractive index lower than the refractive index of the high refractive index layer.

<5> The solid-state imaging device recited in <2>, in which a plurality of the high refractive index layer is formed.

<6> The solid-state imaging device recited in <5>, in which the high refractive index layers are each formed, between the transparent protective substrate and the bonding resin layer having the refractive index lower than the refractive index of the high refractive index layer and between the bonding resin layer and the solid-state imaging element.

<7> The solid-state imaging device recited in <2>, in which the high refractive index layer includes a bonding resin layer having a high refractive index and formed between the transparent protective substrate and the solid-state imaging element.

<8> The solid-state imaging device recited in any one of <1> to <7>, in which the high refractive index layer includes a transparent protective substrate made to have a high refractive index, and a bonding resin layer is formed between the transparent protective substrate made to have the high refractive index and the solid-state imaging element.

<9> The solid-state imaging device recited in any one of <1> to <8>, in which the high refractive index layer is formed in a prior stage of the transparent protective substrate, and a bonding resin layer is formed between the transparent protective substrate and the solid-state imaging element.

<10> The solid-state imaging device recited in any one of <1> to <9>, in which a lens group including a plurality of lenses that adjusts a focal point is formed by pasting the lens group in a final stage to a most prior stage in the light incident direction.

<11> The solid-state imaging device recited in <10>, in which the lens group in the final stage includes a concave lens, a convex lens, and a combination of the concave lens and the convex lens.

<12> The solid-state imaging device recited in any one of <1> to <11>, in which the high refractive index layer includes a single-layer film.

<13> The solid-state imaging device recited in any one of <1> to <12>, in which the surface layer of the imaging surface of the solid-state imaging element is a flattening film that flattens a surface layer of an on-chip lens.

<14> An imaging device in which a high refractive index layer having a refractive index higher than a refractive index of any one of a transparent protective substrate and a surface layer of an imaging surface of a solid-state imaging element is formed in a prior stage of the solid-state imaging element in a light incident direction.

<15> An electronic apparatus in which a high refractive index layer having a refractive index higher than a refractive index of any one of a transparent protective substrate and a surface layer of an imaging surface of a solid-state imaging element is formed in a prior stage of the solid-state imaging element in a light incident direction.

REFERENCE SIGNS LIST

1 Imaging device
10 Integrated portion
11 Solid-state imaging element (of CPS structure)
11*a* Lower substrate (logic substrate)
11*b* Upper substrate (pixel sensor substrate)
11*c* Color filter
11*d* On-chip lens
11*e* Flattening film
12 High refractive index layer
12' Highly-refractive bonding resin 12" High refractive protective substrate
13 Bonding resin
14 Protective substrate
16 Lens group
17 Circuit board
18 Actuator
19 Connector
20 Spacer
21 Pixel region
22 Control circuit
23 Logic circuit
32 Pixel
51 Photodiode
81 Silicon substrate
83 Wiring layer
86 Insulation film
88 Through silicon via
91 Solder mask
101 Silicon substrate
103 Wiring layer
105 Through chip via
106 Connection wiring
108 Through silicon via

The invention claimed is:

1. A solid-state imaging device, comprising:
a transparent protective substrate;
a solid-state imaging element;
a bonding resin layer; and
a high refractive index layer in a light incident direction, wherein
a refractive index of the high refractive index layer is higher than a refractive index of one of the transparent protective substrate or a surface layer of an imaging surface of the solid-state imaging element,
a refractive index of the bonding resin layer is lower than the refractive index of the high refractive index layer,
the high refractive index layer is between the transparent protective substrate and the solid-state imaging element, and
the high refractive index layer is between the solid-state imaging element and the bonding resin layer.

2. The solid-state imaging device according to claim 1, further comprising a plurality of high refractive index layers.

3. The solid-state imaging device according to claim 2, wherein each of the plurality of high refractive index layers is between the transparent protective substrate and the bonding resin layer and between the bonding resin layer and the solid-state imaging element.

4. The solid-state imaging device according to claim 1, wherein
the high refractive index layer includes the bonding resin layer having a high refractive index, and
the bonding resin layer is between the transparent protective substrate and the solid-state imaging element.

5. The solid-state imaging device according to claim 1, wherein
the high refractive index layer includes the transparent protective substrate with a high refractive index, and
the bonding resin layer is between the transparent protective substrate and the solid-state imaging element.

6. The solid-state imaging device according to claim 1, wherein the bonding resin layer is between the transparent protective substrate and the solid-state imaging element.

7. The solid-state imaging device according to claim 1, further comprising a lens group including a plurality of lenses configured to adjust a focal point.

8. The solid-state imaging device according to claim 7, wherein the lens group includes a concave lens, a convex lens, and a combination of the concave lens and the convex lens.

9. The solid-state imaging device according to claim 1, wherein the high refractive index layer includes a single-layer film.

10. The solid-state imaging device according to claim 1, wherein the surface layer of the imaging surface of the solid-state imaging element is a flattening film that flattens a surface layer of an on-chip lens.

11. An imaging device, comprising:
a transparent protective substrate;
a solid-state imaging element;
a bonding resin layer; and
a high refractive index layer in a light incident direction, wherein
a refractive index of the high refractive index layer is higher than a refractive index of one of the transparent protective substrate or a surface layer of an imaging surface of the solid-state imaging element,
a refractive index of the bonding resin layer is lower than the refractive index of the high refractive index layer,
the high refractive index layer is between the transparent protective substrate and the solid-state imaging element, and
the high refractive index layer is between the solid-state imaging element and the bonding resin layer.

12. An electronic apparatus, comprising:
a transparent protective substrate;
a solid-state imaging element;
a bonding resin layer; and
a high refractive index layer in a light incident direction, wherein
a refractive index of the high refractive index layer is higher than a refractive index of one of the transparent protective substrate or a surface layer of an imaging surface of the solid-state imaging element,
a refractive index of the bonding resin layer is lower than the refractive index of the high refractive index layer,
the high refractive index layer is between the transparent protective substrate and the solid-state imaging element, and
the high refractive index layer is between the solid-state imaging element and the bonding resin layer.

* * * * *